US010776744B1

(12) United States Patent
Kimchi et al.

(10) Patent No.: US 10,776,744 B1
(45) Date of Patent: Sep. 15, 2020

(54) SIMULATED FLIGHT DATA TO DETERMINE DELIVERY TIMEFRAMES FOR AERIAL ITEM DELIVERY

(71) Applicant: Amazon Technologies, Inc., Seattle, WA (US)

(72) Inventors: Gur Kimchi, Bellevue, WA (US); Robert Wayne Roth, Renton, WA (US)

(73) Assignee: Amazon Technologies, Inc., Seattle, WA (US)

( * ) Notice: Subject to any disclaimer, the term of this patent is extended or adjusted under 35 U.S.C. 154(b) by 525 days.

(21) Appl. No.: 15/473,481

(22) Filed: Mar. 29, 2017

(51) Int. Cl.
  *G08G 5/00* (2006.01)
  *G06Q 10/08* (2012.01)
  *G06F 30/20* (2020.01)
  *B64C 39/02* (2006.01)
  *B64D 45/00* (2006.01)
  *H04L 29/08* (2006.01)

(52) U.S. Cl.
  CPC .......... *G06Q 10/083* (2013.01); *G06F 30/20* (2020.01); *G06Q 10/087* (2013.01); *G08G 5/0004* (2013.01); *G08G 5/0017* (2013.01); *H04L 67/02* (2013.01)

(58) Field of Classification Search
  CPC ............ B64C 39/024; G06Q 10/06316; G05B 13/041
  See application file for complete search history.

(56) References Cited

U.S. PATENT DOCUMENTS

| | | | |
|---|---|---|---|
| 2011/0173042 A1* | 7/2011 | Riepshoff | G06Q 10/0639 705/7.26 |
| 2015/0269846 A1* | 9/2015 | De Prins | G08G 5/0043 701/120 |
| 2017/0283057 A1* | 10/2017 | Thompson | B64C 39/024 |
| 2017/0323274 A1* | 11/2017 | Johnson | G06Q 10/0635 |
| 2018/0257777 A1* | 9/2018 | Lesser | B64D 45/00 |
| 2019/0039732 A1* | 2/2019 | Lesser | B64C 39/02 |
| 2019/0145794 A1* | 5/2019 | Ketchell, III | G01C 21/3691 701/439 |

* cited by examiner

*Primary Examiner* — Talia F Crawley
(74) *Attorney, Agent, or Firm* — Athorus, PLLC

(57) ABSTRACT

Described are example systems and methods that utilize simulated and/or actual flight data to determine an aerial delivery time estimate between a source location and a delivery destination, based on current flight conditions. For example, multiple flight simulations along a flight path between a source location and a delivery destination may be performed based on various different flight conditions and the flight time determined from the simulations may be maintained in a data store, associated with the flight path and simulated flight conditions. When a request for item information is received, current flight conditions may be determined and used to determine an estimated flight time based on stored simulated flight data having similar flight conditions to the current flight conditions.

20 Claims, 12 Drawing Sheets

SIMULATED FLIGHT DATA TO DETERMINE DELIVERY TIMEFRAMES FOR AERIAL ITEM DELIVERY

BACKGROUND

Physical delivery of items to user specified locations has improved dramatically over the years, with some retailers offering next day delivery of ordered items. The final, or last mile delivery of physical items to a user specified location is traditionally accomplished using a human controlled truck, bicycle, cart, etc. For example, a user may order an item for delivery to their home. The item may be picked from a materials handling facility, packed and shipped to the customer for final delivery by a shipping carrier, such as the United States Postal Service, FedEx, or UPS. The shipping carrier will load the item onto a truck that is driven by a human to the final delivery location and the human driver, or another human companion with the driver, will retrieve the item from the truck and complete the delivery to the destination. For example, the human may hand the item to a recipient, place the item on the user's porch, store the item in a post office box, etc.

Some sellers of items offer free shipping and/or delivery estimates based on the shipping option selected. For example, some electronic commerce websites offer free two-day shipping, indicating that the item should be delivered to the customer selected delivery address within two days. However, systems do not typically provide any further details at the time of purchase as to when the item is expected to arrive and the estimated delivery timeframe is based on typical carrier route and delivery expectations.

DETAILED DESCRIPTION

Figure 1:
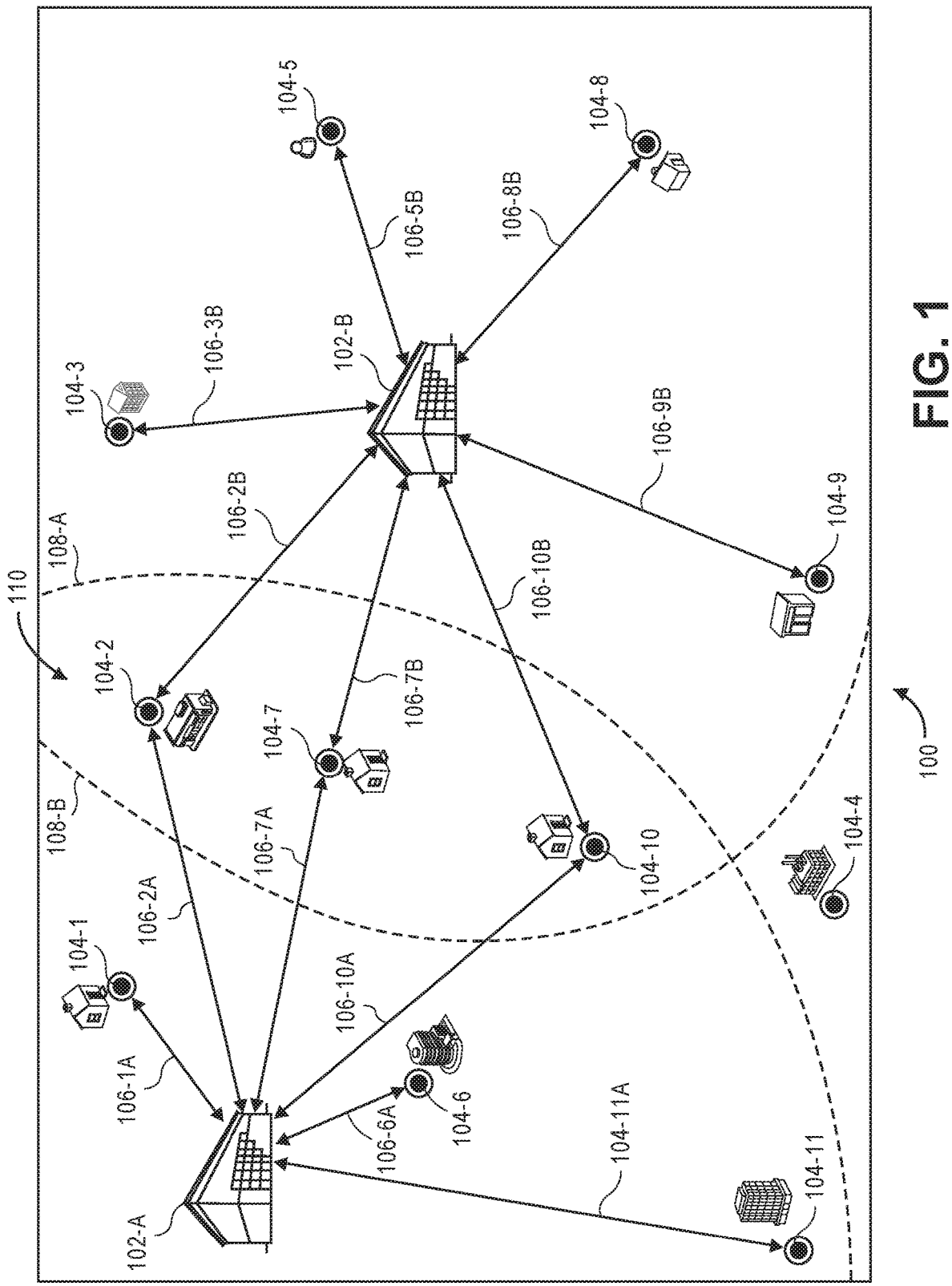
FIG. 1 illustrates an environment with example flight paths between source locations and delivery destinations, in accordance with implementations of the present disclosure.

As is set forth in greater detail below, described are example systems and methods generate simulation data for multiple flights between a source location and a delivery destination based on various flight conditions. The simulated data may then be used to determine an aerial delivery time estimate, estimated energy consumption, etc., between a source location and a delivery destination, based on current flight conditions. For example, multiple flight simulations along a flight path between a source location and a delivery destination may be performed based on various different flight conditions and the flight time, energy consumption, etc. determined from the simulations may be maintained in a data store, associated with the flight path and simulated flight conditions.

In one implementation, multiple (e.g., hundreds to thousands) flight simulations along the same or similar flight path between a source location, such as a materials handling facility, and a delivery destination, such as a customer's home, may be performed, each simulation utilizing one or more different flight conditions. The resultant flight durations, energy consumptions, etc. determined from the simulations may be stored in the data store and associated with the flight path between that source location and delivery destination, along with the flight conditions used for the simulation. These multiple simulations may be performed for multiple different flight paths between different source locations and/or different delivery destinations.

In one example, a flight path between each source location and each potential delivery destination (e.g., each known or potential customer specified delivery destination) may be determined and multiple simulations, each simulation with one or more different flight conditions, may be performed for each determined flight path. As each simulation is completed, the flight path, simulated flight data, determined flight duration, estimated energy consumption, corresponding flight conditions, etc. are associated and stored in a flight path data store. In one specific example, an electronic commerce provider may determine flight paths between each source location (e.g., fulfillment center) used by the electronic commerce provider to store and/or ship items to all known, provided, and/or determined potential customer delivery destinations. Multiple flight simulations, each with varying flight conditions, may be performed for each flight path and the resultant information (flight data, flight duration) associated and stored in a flight path data store.

At a time subsequent to storing the simulated flight data in the flight path data store, upon identifying a customer and/or determining a potential delivery destination, the electronic commerce provider may determine current flight conditions and quickly obtain from the flight path data store an initial flight path plan and an estimated flight duration for the flight path plan between a source location and the potential delivery destination that corresponds with the current flight conditions and provide that information to the customer. For example, a customer may submit a request to view a web page of the electronic commerce provider that includes information about an item that the customer is considering for purchase. In response to receiving the request from the customer, or the customer computing device, the electronic commerce provider may determine the source location at which the item is stored, the delivery destination associated with the user, the current flight conditions, and query the flight path data store to determine the estimated flight duration corresponding to the flight path between the source location and delivery destination that was simulated using flight conditions that correspond to the current flight conditions. The determined flight duration may then be utilized by the electronic commerce provider to include on the requested page to provide real time delivery information that is based on the flight path and current flight conditions. For example, if the estimated flight duration is twenty minutes, the electronic commerce provider may present on the web page with the item information an option for aerial delivery of the item in less than thirty minutes from the time the item is ordered by the customer.

In some implementations, the simulated flight data and flight durations determined for a flight path based on varying flight conditions may be utilized as a service to facilitate item delivery and/or aerial transport time information to other entities. For example, a service may be provided that aerially transports items from a source location to a delivery destination on behalf of a merchant or seller of those items. In such an example, the service may receive an indication of a source location, delivery destination and/or a flight path, determine current flight conditions, obtain from the data store a flight duration corresponding to the flight path that was simulated under the flight conditions that correspond with the current flight conditions, and provide the flight duration determined from the flight path data store as the estimated flight duration.

While the examples discussed herein often refer to a fulfillment center as a source location and a customer specified location as a delivery destination, the disclosed implementations are equally applicable to other forms of locations. In general, the source location may be any location from which an aerial transport of an item may be initiated and a delivery destination may be any location at which delivery of the item may be completed. For example, a source location may include, but is not limited to, a ground based fulfillment center, an aerial based fulfillment center, a water based fulfillment center, a fulfillment center located beyond the earth's troposphere, a customer's home, a business address, etc. Likewise, a delivery destination may include, but is not limited to, a customer's home address, a geographic coordinate, an automobile (moving or stationary), a water based vehicle (moving or stationary), a building, a park, another aerial vehicle, a location beyond the earth's troposphere, etc.

Flight conditions, as used herein, include any condition that may impact the duration of an aerial flight along a flight path. For example, a flight condition may be, but is not limited to, wind speed, wind direction, temperature, humidity, barometric pressure, lumens level, time of day, precipitation, airspace congestion along a flight path, etc. A current flight condition, or current flight conditions, relate to existing flight conditions occurring at a current point in time as measured or reported by one or more sensors or reporting services. For example, current flight conditions may be received from sensors of a weather station, aerial vehicle sensors operating in an area for which current flight conditions are to be obtained, from government entities, and/or weather services.

FIG. 1 illustrates an environment 100 with example flight paths 106 between source locations and delivery destinations 104, in accordance with implementations of the present disclosure. In this example environment 100, there are two source locations 102-A and 102-B and eleven delivery destinations 104-1, 104-2, 104-3, 104-4, 104-5, 104-6, 104-7, 104-8, 104-9, 104-10, and 104-11. In accordance with the described implementations, flight paths 106 between one or more of the source locations and each delivery destination may be specified.

In some implementations, a flight path for every source location and delivery destination combination may be specified such that a flight path 106 exists between each source location and each delivery destination. In other implementations, as illustrated in FIG. 1, some delivery destinations will only be associated with one flight path from one source location, while other delivery destinations are associated with multiple flight paths, one flight path from each of a plurality of source locations. For example, a maximum aerial delivery range 108 may be specified for each source location and flight paths determined from that source location to each delivery destination that is within the maximum aerial delivery range of the source location. Because the maximum aerial delivery range 108 of a source location may overlap with the maximum aerial delivery range 108 of one or more other source locations 102, delivery destinations within the overlapping regions will be associated with multiple flight paths, one for each source location with which the delivery destination is within range.

As illustrated in FIG. 1, a maximum aerial delivery range 108-A is associated with source location 102-A and a maximum aerial delivery range 108-B is associated with source location 102-B, and the two maximum aerial delivery ranges 108-B partially overlap, as illustrated by overlapping region 110. A maximum aerial delivery range may be any defined distance, area or region. In one example, the maximum aerial delivery range may correspond to a maximum flight path that may be navigated by aerial vehicles departing from the source location. For example, if the aerial vehicle utilizes a fuel source that allows a total flight duration of seventy minutes, and the maximum speed of the aerial vehicle is sixty miles per hour, the maximum aerial delivery range 108 may include a thirty mile radius around a source location—so the aerial vehicle under optimal flight conditions can aerially navigate both directions between the source location and the destination location, and have time to deliver the item to the delivery destination, during the total flight duration of the aerial vehicle. In other implementations, the maximum aerial delivery range 108 may correspond to other factors. For example, the maximum aerial delivery range 108 may be determined, in part, based on restricted airspace (e.g., airspace above or around airports, school, etc.), geographic obstacles (e.g., mountains), etc. In still other examples, the maximum aerial delivery range 108 may be based on a distance the aerial vehicle will aerially navigate from the source location to the delivery destination, and then to another location, such as another fulfillment center, a transport vehicle, etc. For example, in one implementation, a maximum aerial delivery range for an aerial vehicle may consider source location 102-A as the origin, delivery destination 104-7 as the location at which an item will be delivered and source location 102-B as a final destination for the aerial vehicle.

Returning to FIG. 1, flight paths 106-1A, 106-2A, 106-6A, 106-7A, 106-10A, and 106-11A between the source location 102-A and each respective delivery destination 104-1, 104-2, 104-6, 104-7, 104-10, and 104-11 within the maximum aerial delivery range 108-A is determined. Likewise, flight paths 106-2B, 106-3B, 106-5B, 106-7B, 106-8B, 106-9B, and 106-10B between the source location 102-B and each respective delivery destination 104-2, 104-3, 104-5, 104-7, 104-8, 104-9, and 104-10 within the maximum aerial delivery range 108-B is determined.

A flight path may specify one or more flight parameters to be followed by an aerial vehicle as it aerially navigates between a source location and a delivery destination. For example, the flight path may specify ranges or areas regarding heading, speed, altitude, coordinates, etc., and the aerial vehicle may operate within those ranges as it navigates the flight path.

Figure 2:
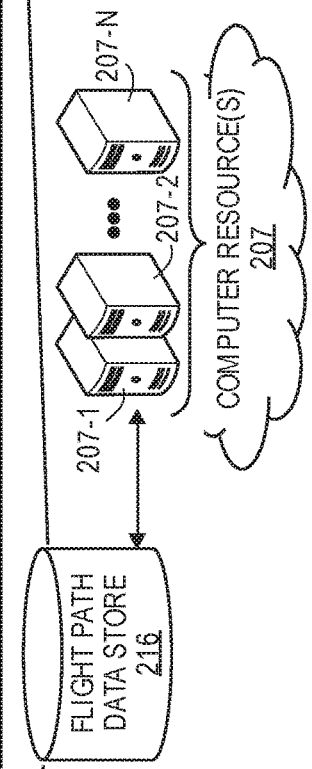
FIG. 2 illustrates a portion of a flight path lookup table accessible from one or more computing resources, in accordance with implementations of the present disclosure.

For each determined flight path 106, a plurality of flight simulations may be performed, each flight simulation utilizing one or more different flight conditions. For example, FIG. 2 illustrates a portion of a flight path lookup table 200 maintained in a flight path data store 216 that is accessible by one or more computing resources 207, such as computer resources 207-1, 207-2 . . . 207-N, in accordance with implementations of the present disclosure. The flight path lookup table 200 includes simulated flight path data for each simulated flight along each determined flight path. In the illustrated example, the portion of the flight path lookup table illustrated in FIG. 2 includes simulated flight path data for flight path 106-7B (FIG. 1), as illustrated by the flight path indicator in column 201. Each row of the flight path lookup table 200 corresponds to a different flight simulation along a flight path, such as flight path 106-7B. In the illustrated example, twenty different flight simulations for flight path 106-7B are represented. As illustrated, each flight simulation is performed with one or more different flight conditions. In the illustrated example, the flight conditions used in each simulation include wind speed 202-1, wind direction 202-2, temperature 202-3, time of day 202-4, precipitation 202-5, lumens level 202-6, airspace congestion 202-7, and humidity 202-N. As will be appreciated, more, less, and/or different flight conditions may be utilized with each simulation along each flight path. Likewise, in some implementations, multiple flight simulations may be aggregated or averaged to represent a range of flight conditions and represented as a single flight simulation in the flight path lookup table 200. For example, the first row 206 may be representative of multiple flight simulations (hundreds, thousands, or more) along flight path 106-7B in which the flight condition of wind speed is varied between zero and five miles-per-hour and all other flight conditions are held constant. The resulting flight duration 204 and energy consumption 206 may each then be an average of the respective flight durations and energy consumptions determined for each simulation, a maximum flight duration for the multiple simulations, an estimated energy consumptions for the multiple simulations, etc.

As illustrated in FIG. 2, flight conditions may be varied for each flight path and multiple flight simulations performed for each flight path under each of the varying flight conditions. The resulting simulated flight path data, including the flight conditions 202 used for the simulation, and the resulting flight duration 204 and energy consumption 206 are associated with the flight path and stored in the flight path lookup table 200 that is maintained in the flight path data store 216.

Figure 3:
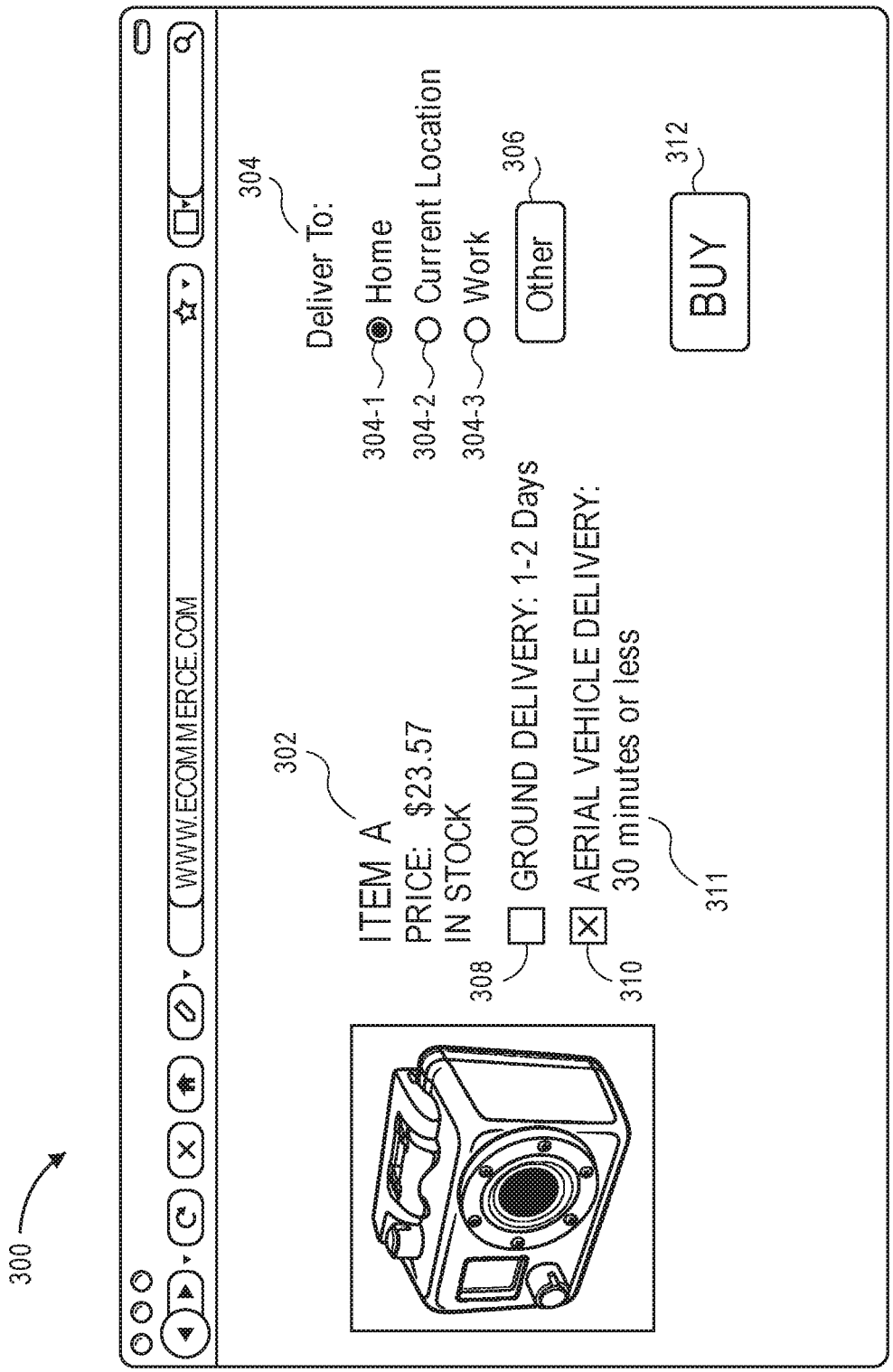
FIG. 3 is an illustration electronic commerce website page through which an item may be obtained for aerial delivery to a delivery destination, in accordance with implementations of the present disclosure.

FIG. 3 is an illustration of an electronic commerce website page 300 through which an item, such as Item A 302, may be requested for aerial delivery to a delivery destination, in accordance with implementations of the present disclosure. The page 300 may include information about the item, such as the item price, whether the item is in stock, etc. Likewise, a customer viewing the page 300 may specify a delivery destination 304. In some implementations, the customer may be recognized when the customer first requests the page 300 and a default or preferred delivery destination, such as Home 304-1, may be selected as the delivery destination. The customer may select a different delivery destination, such as Current Location 304-2, Work 304-3, or specify a different delivery destination by selecting the Other control 306. The presented delivery destinations such as Home 304-1 and Work 304-3 may correspond to a specific location previously specified by the user or otherwise determined by the user. The delivery destination of Current Location 304-2 may be determined based on position information provided by one or more devices associated with the user. For example, current position information, such as global positioning system (GPS) data, may be provided by a portable device (e.g., cellular phone, wearable, watch) associated with the user. The position information may then be utilized as the Current Location delivery destination for the customer. Finally, any other delivery location (e.g., address, coordinate, etc.) may be specified by the customer.

If a default delivery address can be determined for the customer, and/or upon receiving a selection of a delivery destination, the described implementations may determine current flight conditions between one or more source locations at which inventory that includes the item is maintained and the delivery destination. For example, when a user visits an electronic commerce website, the customer may be identified (e.g., based on cookies, user login credentials, etc.) and a default delivery destination determined for the identified customer. When the customer submits a request to view a webpage for an item, such as webpage 300 for Item A, source locations at which the item is stored in inventory are determined, flight paths between those source locations and the determined default delivery destination are identified, and current flight conditions between the source location(s) and the delivery destination are determined. The flight path lookup table maintained in the flight path data store may then be queried to determine an estimated flight duration between the source location(s) and the delivery destination based on the current flight conditions. Based on the estimated flight duration obtained from the flight path lookup table, a delivery timeframe 311, also referred to herein as a promised delivery timeframe, may be presented to the user that corresponds with the determined estimated flight duration.

As discussed further below, in some implementations, the promised delivery timeframe 311 may be a defined time duration, such as thirty minutes or less and the promised delivery timeframe 311 may only be presented if the determined estimated flight duration is below a defined threshold. If the estimated flight duration is above the defined threshold, the promised delivery timeframe 311 may not be presented to the customer, but the customer may still be able to select an aerial delivery option 310.

In still other implementations, the promised delivery timeframe 311 may not be a defined timeframe and may be dependent upon the determined estimated flight duration. For example, if the flight path lookup table indicates a flight duration of forty minutes along the flight path due to the current flight conditions, the promised delivery timeframe may be presented as fifty-five minutes or less. As discussed below, the additional time between the determined flight duration and the promised delivery timeframe 311 may be utilized to account for time necessary to prepare the item for aerial transport (e.g., retrieve the item from inventory, load the item into an aerial vehicle, etc.).

In still other implementations, if the determined estimated flight duration exceeds a defined threshold, the aerial delivery option 310 may not be presented and the webpage may only include an option for other forms of delivery, such as ground delivery 308. Likewise, if the user selects a different delivery destination, the flight path lookup table may be again queried to determine the estimated flight duration from a source location to the updated delivery destination based on current flight conditions between the source location and the updated delivery destination. The webpage 300 may then be updated accordingly based on the determined estimated flight duration for the updated delivery destination.

Finally, if the user desires to obtain the item represented on the webpage 300, a user may select a control, such as the Buy control 312, to provide an indication that the item is to be delivered to the specified delivery destination 304. While the presented example corresponds to a purchase of an item, the implementations may also be used with items that are rented, leased, borrowed, etc.

By utilizing simulated flight data that is generated before the user requests to view a webpage corresponding to an item to determine an estimated flight duration based on flight conditions, the decision as to whether to present an aerial delivery option 310 and/or a promised delivery timeframe 311 can be done in a matter of milliseconds and included within the initial delivery of the page to a customer device without delaying the generation or delivery of the page.

Figure 4:
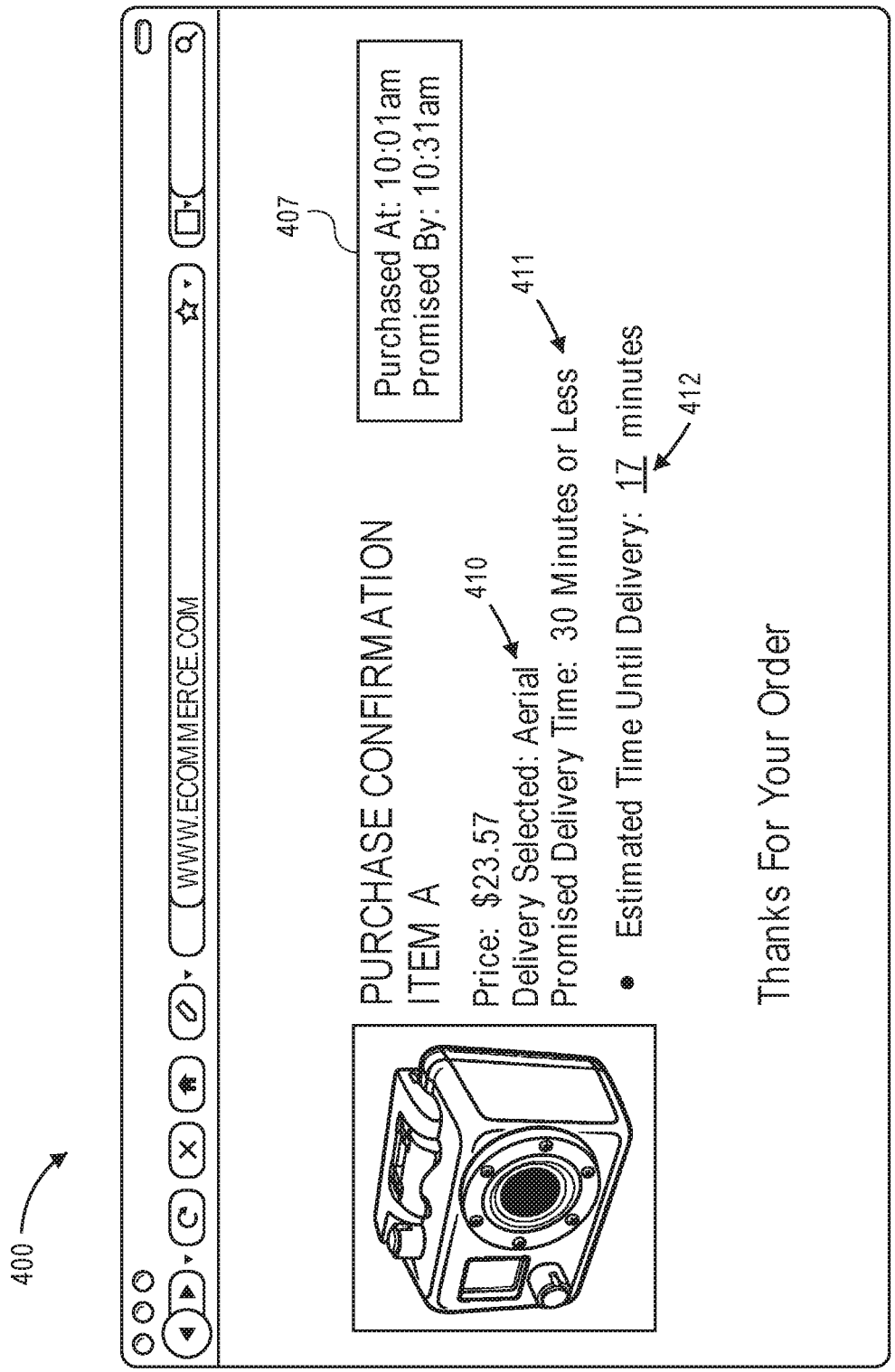
FIG. 4 is an illustration of an electronic commerce website confirmation page indicating a purchase confirmation of the item illustrated in FIG. 3, in accordance with implementations of the present disclosure.

FIG. 4 is an illustration of an electronic commerce website purchase confirmation page 400 indicating a purchase of the item illustrated in FIG. 3, in accordance with implementations of the present disclosure. As illustrated, the purchase confirmation page 400 may include an indication of the selected delivery option, in this instance aerial delivery 410, and the promised delivery timeframe 411 determined based at least in part on the estimated flight duration obtained from the flight path lookup table based on the flight path and current flight conditions. Likewise, in some implementations, the confirmation page 400 may also indicate a purchase time and promised by delivery time 407, indicating the specific time by which item delivery to the delivery destination is promised. In the present example, the customer completed a purchase of the item at 10:01 am, the promised delivery timeframe 411 is thirty minutes or less and, thus, the promised by delivery time 407 is 10:31 am.

In some implementations, the confirmation page 400 may also include an Estimated Time Until Delivery 412. For example, if the flight path data store includes actual flight data along the flight path and corresponding to the current flight conditions, the actual flight data may be utilized alone or in conjunction with the simulated flight data to estimate an actual time remaining until delivery 412. The estimated time until delivery 412 may be updated as the delivery of the item progresses and may be based on the amount of time elapsed in the delivery, the current location of the aerial vehicle that is aerially transporting the item, the current flight conditions as measured by the aerial vehicle, and/or the flight data (actual and/or simulated) maintained in the flight path data store. For example, when the aerial vehicle has navigated one-half of the flight path to the source location, the current flight conditions measured by the aerial vehicle and the position of the aerial vehicle along the flight path may be used to again query the flight path data store and determine an estimated flight duration based on the flight path and current flight conditions. In addition, because the flight path data store includes the flight data, the duration of time remaining in the flight to the delivery destination may be estimated based on the position of the aerial vehicle and the stored flight path data according to the current flight conditions.

Figure 5:
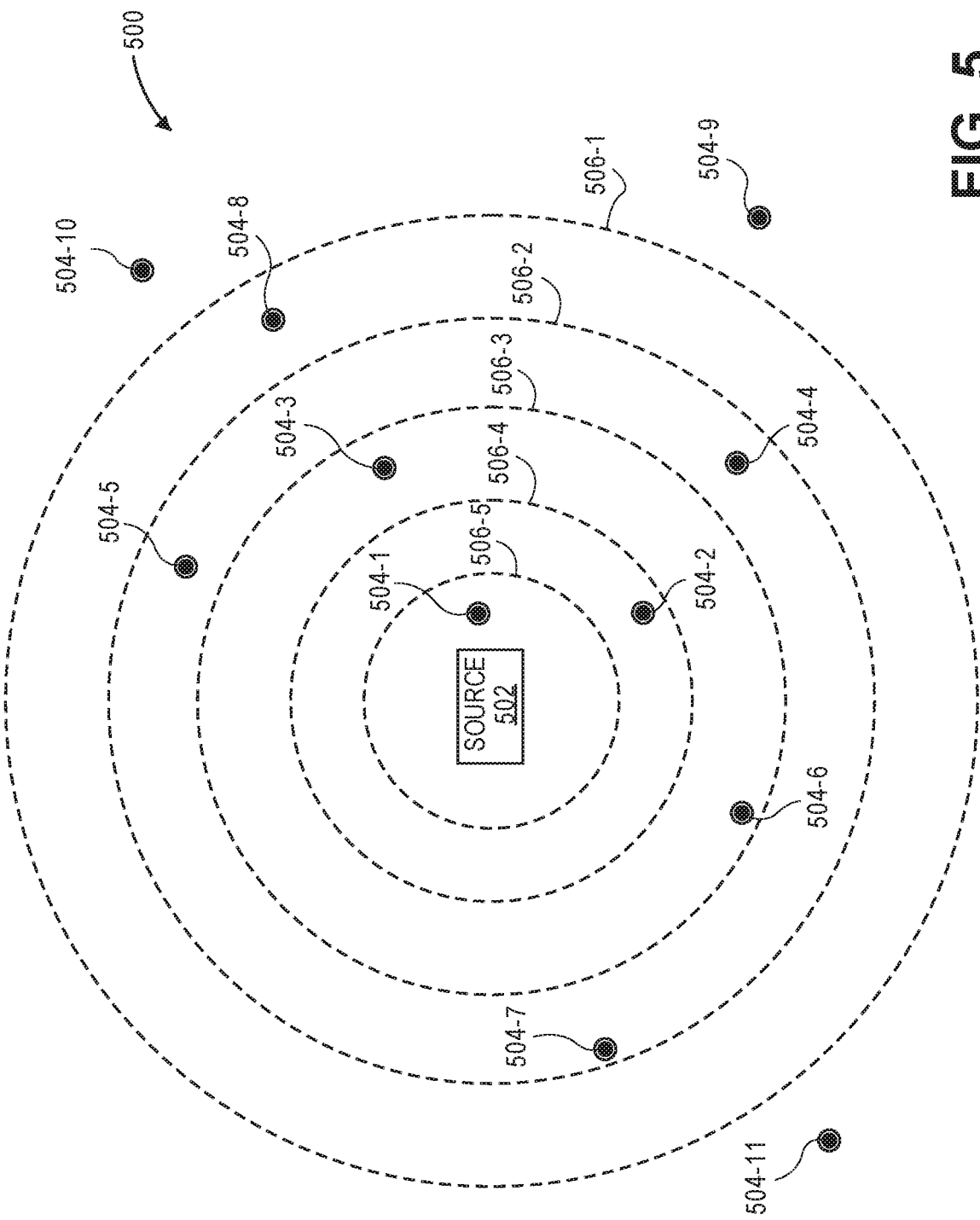
FIG. 5 illustrates an environment with example flight boundaries from a source location based on flight conditions, in accordance with implementations of the present disclosure.

FIG. 5 illustrates an environment 500 with example flight boundaries 506 from a source location 502 based on flight conditions, in accordance with implementations of the present disclosure. In the illustrated example, the simulated flight paths to various delivery destinations under various flight conditions, as discussed above, may be aggregated to determine regions or boundaries 506 around the source location 502 based on the various flight conditions. For example, a threshold flight duration may be specified, such as thirty minutes, and the simulated flight data may be utilized to determine flight boundaries within which delivery destinations 504 can be reached within the threshold flight duration under different flight conditions. For example, during optimal flight conditions, the simulated flight data may indicate that any delivery destination within boundary 506-1 may be reached within the threshold flight duration. Under a second set of flight conditions, the simulated flight data may indicate that only delivery destinations within the boundary 506-2 may be reached within the threshold flight duration. Under a third set of flight conditions, the simulated flight data may indicate that only delivery destinations within the boundary 506-3 may be reached within the threshold flight duration. Under a fourth set of flight conditions, the simulated flight data may indicate that only delivery destinations within the boundary 506-4 may be reached within the threshold flight duration. Under a fifth set of flight conditions, the simulated flight data may indicate that only delivery destinations within the boundary 506-5 may be reached within the threshold flight duration.

As will be appreciated, any number of boundaries may be specified for a source location. Likewise, more than one set of flight conditions may correspond to the same boundary. For example, flight simulations with flight conditions of high wind and no precipitation may correspond to the boundary 506-5. Likewise, flight conditions of high wind and high precipitation may also correspond to boundary 506-5. Based on the simulated flight data with the varying flight conditions, each of the different sets of flight conditions may be associated with a boundary 506. In such an example, when a request is received, the source location and delivery destination are determined, along with the current flight conditions between the source location and delivery destination. Based on the current flight conditions, a corresponding boundary 506 associated with the flight conditions is determined. Finally, if it is determined that the delivery destination is within the boundary that corresponds to the current flight conditions, an aerial delivery option and/or promised delivery timeframe may be presented to the customer.

As one example, if the delivery destination is delivery destination 504-9, 504-10, or 504-11, it may be determined that there are no flight conditions in which aerial delivery from the source location 502 can complete a delivery within the threshold delivery time. In comparison, if the delivery destination is delivery destination 504-8, aerial delivery can be completed within the threshold delivery time under flight conditions associated with boundary 506-1. If the delivery destination is delivery destination 504-4, 504-5, or 504-7, aerial delivery can be completed within the threshold delivery timeframe under flight conditions associated with boundary 506-1 or boundary 506-2. If the delivery destination is delivery destination 504-3 or 504-6, aerial delivery can be completed within the threshold delivery timeframe under flight conditions associated with boundary 506-1, 506-2, or 506-3. If the delivery destination is delivery destination 504-2, aerial delivery can be completed within the threshold delivery timeframe under flight conditions associated with boundary 506-1, 506-2, 506-3, or 506-4. Finally, if the delivery destination is delivery destination 504-1, aerial delivery can be completed within the threshold delivery timeframe under flight conditions associated with boundary 506-1, 506-2, 506-3, 506-4, or 506-5.

Similar to the example discussed above with respect to FIGS. 1 and 2, flight conditions and corresponding boundaries 506 may be associated and stored in the flight path lookup table that is maintained in the flight path data store. In such an example, rather than associating the simulated flight with a specific flight path, the simulated flight and corresponding flight conditions are associated with a boundary that can be reached within a specified threshold delivery timeframe. Likewise, the boundary may correspond to a region, positions, geolocations, or other area descriptor. When a source location and delivery destination are determined, the current flight conditions are determined and a corresponding boundary is specified based on the current flight conditions. It may then be quickly determined if the delivery destination is within the specified boundary and, if so, the aerial delivery option and/or promised delivery timeframe may be presented.

Figure 6:
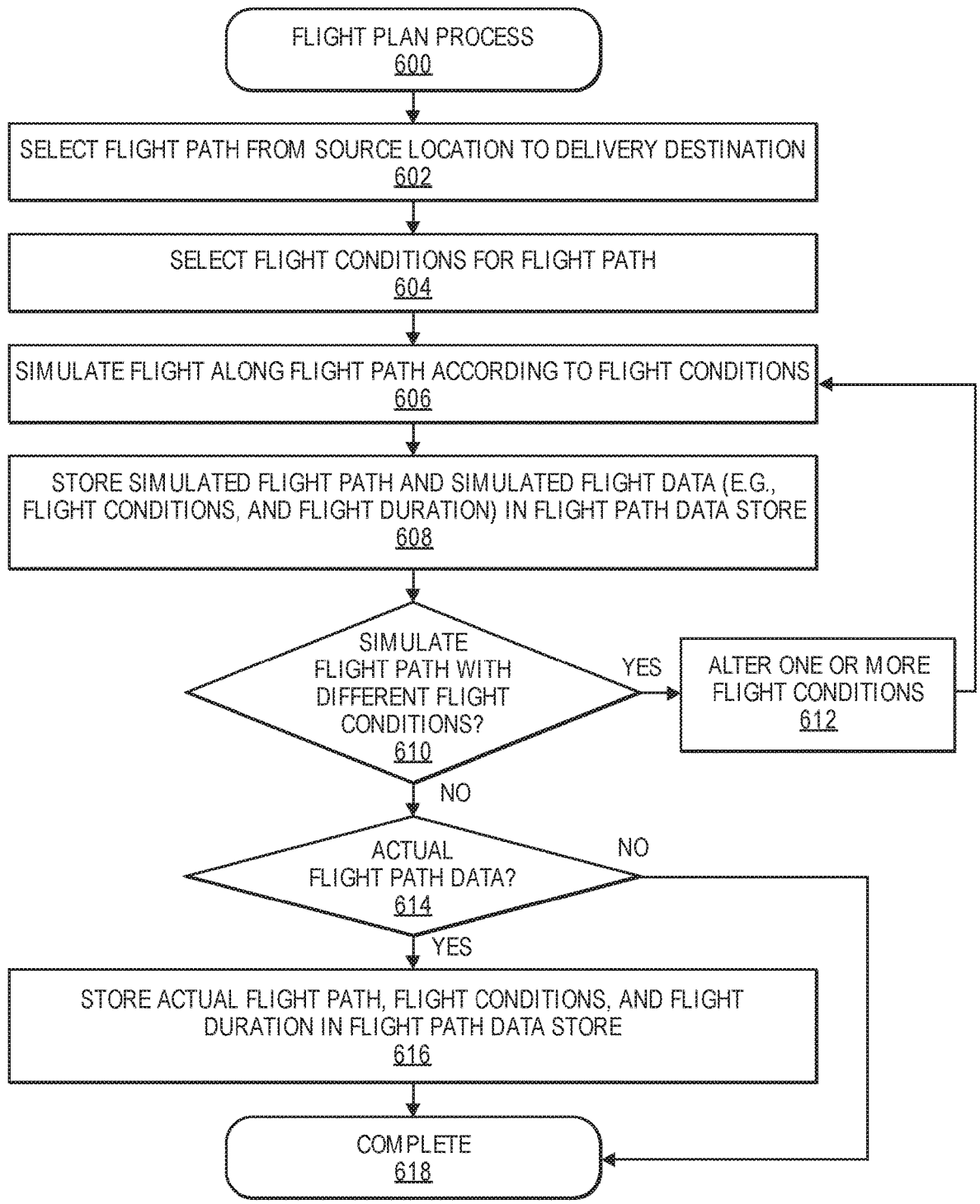
FIG. 6 is a flow diagram of an example flight plan process, in accordance with implementations of the present disclosure.

FIG. 6 is a flow diagram of an example flight plan process 600, in accordance with implementations of the present disclosure. The example process 600 begins by selecting a flight path from a source location to a delivery destination, as in 602. As discussed above, a flight path may specify one or more parameters or ranges of parameters that are to be followed by an aerial vehicle as the aerial vehicle aerially navigates the flight path between a source location and a delivery destination.

For the selected flight path, flight conditions to be used for simulating a flight along the flight path are selected, as in 604. A flight condition may include any condition that impacts a duration of a flight between a source location and a delivery destination. Likewise, any number of flight conditions may be used for simulation of a flight between a source location and a destination location. A flight condition may be, but is not limited to, wind speed, wind direction, temperature, humidity, barometric pressure, lumens level, time of day, precipitation, airspace congestion along a flight path, etc.

Based on the flight path and the selected flight conditions, one or more flights along the flight path according to the selected flight conditions are simulated, as in 606. The simulations may specify energy consumption, the amount of time a flight path passes over a particular type of terrain (e.g., building, fields, water, parks, etc.), aerial vehicle type, etc. In some implementations, multiple simulations may be performed along the flight path according to the flight conditions and the results may be aggregated (e.g., averaged) resulting in a simulated flight and corresponding flight data along the flight path and corresponding to the flight conditions. In other implementations, one or more flight simulations may be performed along the flight path and corresponding to the flight conditions and each simulation may be maintained as a separate simulated flight and corresponding simulated flight data.

The simulated flight and corresponding simulated flight data, including the flight conditions and determined flight duration, are stored in the flight path lookup table that is maintained in the flight path data store, as in 608. As discussed above, each simulated flight path and corresponding flight data may be stored in a row of the flight path lookup table and associated with the flight path (e.g., FIG. 1) or the boundary (e.g., FIG. 5).

A determination is then made as to whether additional flights along the flight path between the source location and delivery destination are to be simulated corresponding to different flight conditions, as in 610. If it is determined that additional simulations along the flight path with different flight conditions are to be performed, one or more flight conditions are altered, as in 612. In some implementations, every different combination of flight conditions may be specified and corresponding flights simulated along the flight path. Upon altering one or more flight conditions, the example process returns to block 612 and continues.

If it is determined that additional flight simulations along the flight path are not to be performed, a determination is made as to whether any actual flight path data along the flight path has been received from aerial vehicles as those aerial vehicles aerially navigate the flight path. Actual flight path data may be recorded during aerial navigation by an aerial vehicle between a source location and a delivery destination and/or between the delivery destination and the source location. Actual flight data may include current flight conditions as measured by the aerial vehicle, actual flight duration, heading, pose, speed, altitude, duration, energy consumption, etc.

If it is determined that actual flight path data has been received, as in 614, the actual flight path data is associated with the flight path and stored in the flight path data store, as in 616. In some implementations, the actual flight path data may be indicated as actual, compared to simulated. In other implementations, the actual flight path data may replace the simulated flight path data having the same or similar flight conditions. In still other examples, it may be required that a defined number or amount of actual flight path data be received and recorded before the simulated flight path data is replaced with actual flight path data. In such an example, the received actual flight path data may be aggregated (e.g., averaged or otherwise combined) and the resultant flight path data stored as the actual flight path data and the flight path.

After storing the actual flight path data, or if it is determined that there is no actual flight path data for the flight path, the example process completes, as in 618. The example process 600 may be periodically performed and the simulated data determined each time the process 600 is performed may be included in the flight path lookup table. Likewise, the example process 600 may be performed for every flight path determined between a source location and a destination location. In some examples, all potential customer delivery destinations may be determined and all viable or possible flight paths considered and processed using the example process 600 so that flight path data under varying flight conditions is stored in the flight path data store and quickly accessible.

Figure 7:
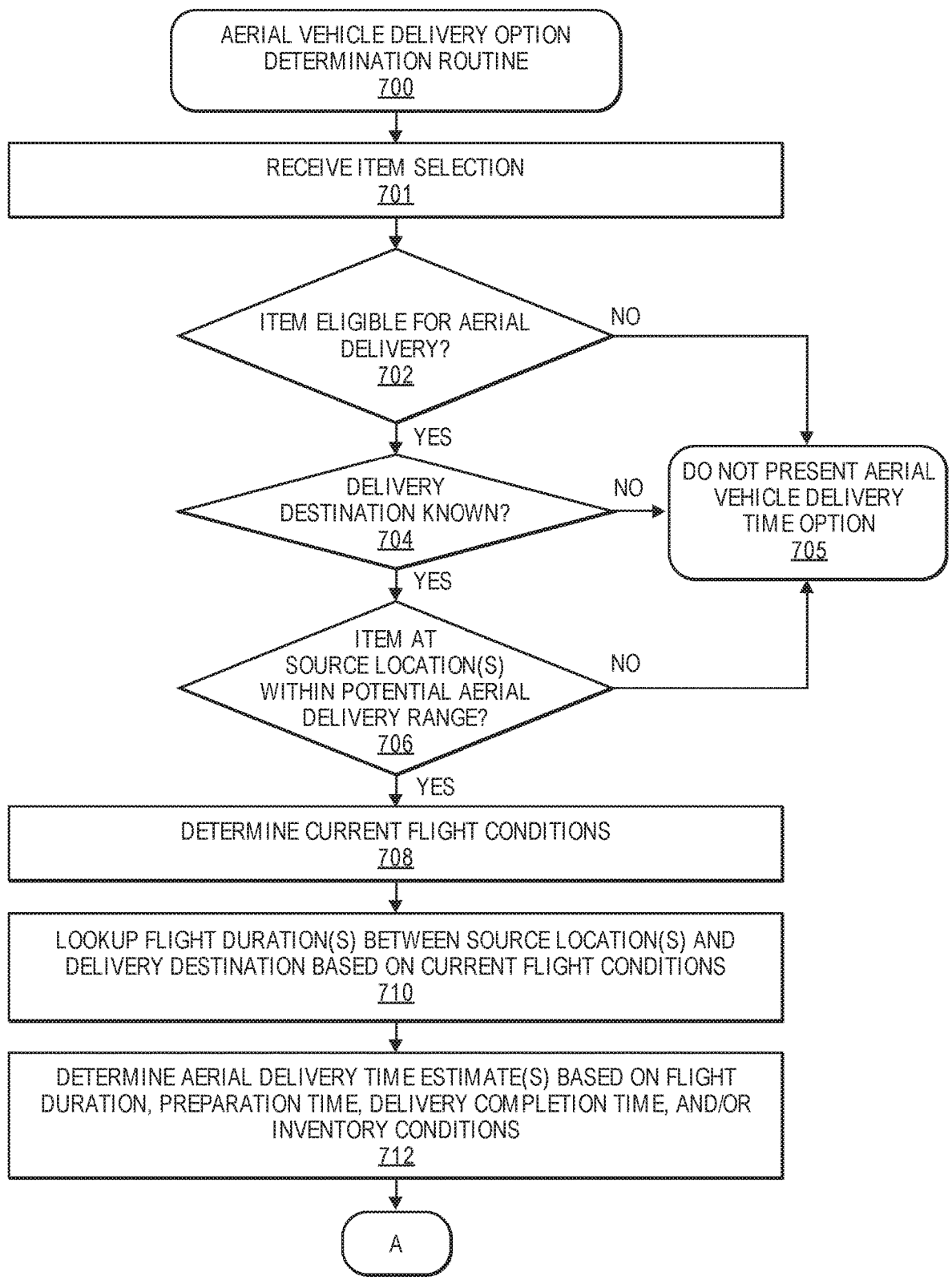
FIG. 7 is a flow diagram of an example aerial vehicle delivery option determination process, in accordance with implementations of the present disclosure.
Figure 7:
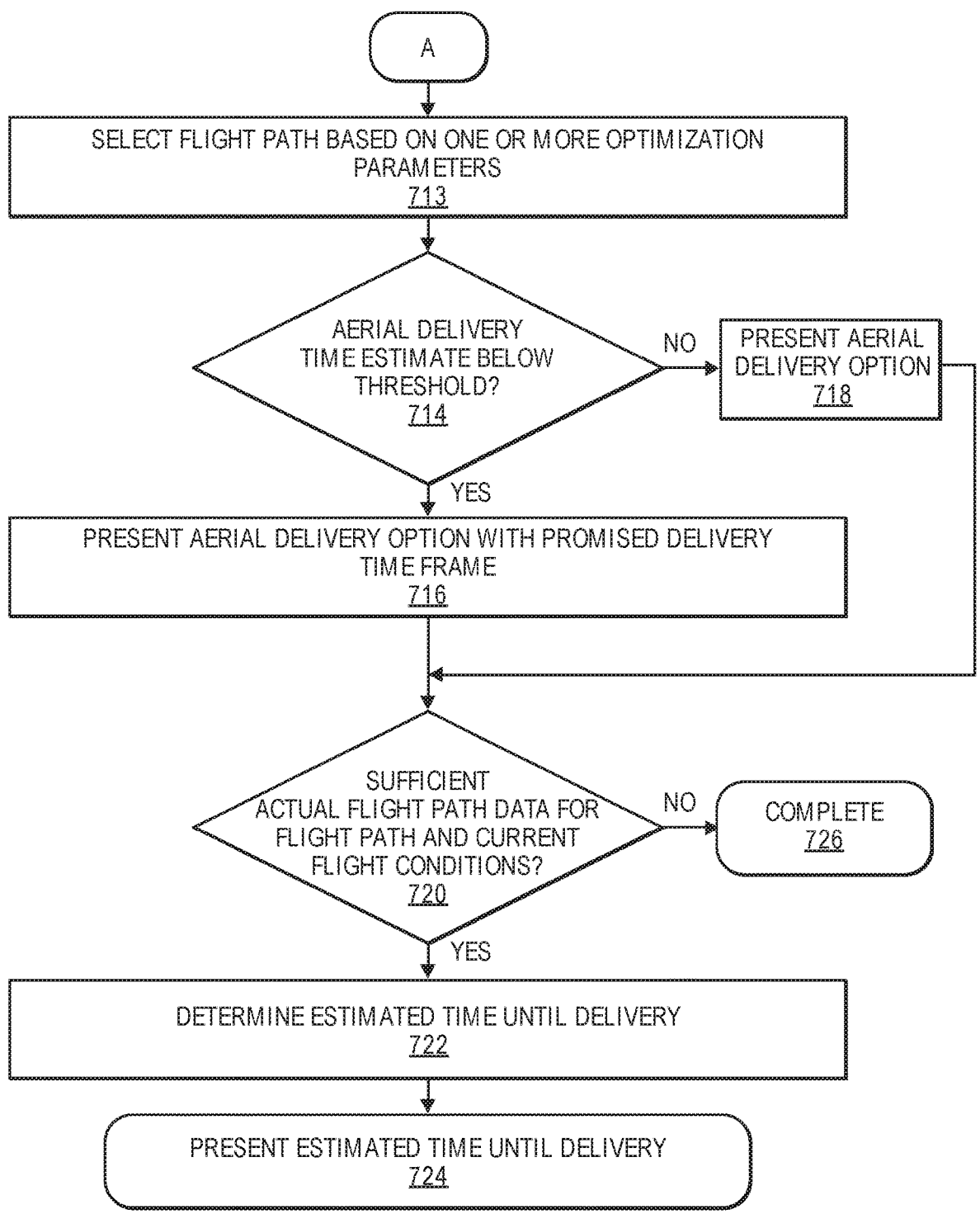

FIG. 7 is a flow diagram of an example aerial vehicle delivery option determination process 700, in accordance with implementations of the present disclosure. The example process 700 begins upon receipt of an item selection, as in 701. An item selection may be, for example, a request by a customer's computing device to view a web page corresponding to an item, a request from a merchant corresponding to an item of the merchant delivered by a service, etc.

Upon receipt of an item selection, a determination is made as to whether the item is eligible for aerial delivery, as in 702. In some implementations, all items may be available for aerial delivery. In such an implementation, the decision at decision block 702 will always be in the affirmative, or the decision block may be removed from the process. However, in other implementations, not all items may be available for aerial delivery. For example, in some implementations, for an item to be available for aerial delivery, the item must fit within a defined dimension container that is carried by the aerial vehicle and be within a defined weight (e.g., less than 10 pounds). In implementations when all items are not eligible for aerial delivery, an indicator may be maintained in an item data store corresponding to each item that indicates whether the item is eligible for aerial delivery. In other implementations, other techniques may be utilized to determine if an item is eligible for aerial delivery.

If it is determined that the item is eligible for aerial delivery, a determination is made as to whether a delivery destination is known, as in 704. A delivery destination may be known, for example, if the customer from which the item selection was received has specified a delivery destination and/or if a default delivery destination is associated with the customer. For example, the customer may be automatically identified based on a user identifier, internet protocol address (IP address), user name, cookie, application used to submit the request, customer computing device identifier, etc. Once identified, it may be determined whether a default delivery destination is associated with a user profile of the customer and, if so, the default delivery destination may be determined as the delivery destination. As another example, the customer may select a defined delivery destination or may specify a delivery destination. In some implementations, the delivery destination may correspond to a current location of the customer. The current location of the customer may be determined based on position information received from one or more devices associated with the customer.

If the delivery destination is known, a determination is made as to whether an instance of the item is maintained at one or more source locations within a potential aerial delivery range of the delivery destination, as in 706. As discussed above, every delivery destination may be associated with flight paths that are available for aerial delivery of items from a source location to the delivery location. If a flight path exists between the source location and the delivery destination, it may be determined that the source location is within a potential aerial delivery range of the delivery destination. As another example, aerial delivery boundaries, as illustrated in FIG. 5, may be specified for a source location. In such an implementation, if the delivery destination is within one or more of the delivery boundaries of the source location, it may be determined that the source location is within an aerial delivery range of the delivery destination.

If it is determined at decision block 702 that the item is not eligible for aerial delivery, or if it is determined at decision block 704 that the delivery destination is not known, or if it is determined at decision block 706 that the item is not at a source location that is within a potential aerial delivery range of the delivery destination, the example process 700 completes and an aerial vehicle delivery option is not provided in response to the item selection, as in 705. However, if it is determined in decision block 706 that an instance of the item is at a source location that is within a potential aerial delivery range of the delivery destination, current flight conditions between the source location and the delivery destination are determined, as in 708. Current flight conditions may be obtained from one or more sources, such as a weather station at the source location, a weather station between the source location and the delivery destination, from other aerial vehicles currently located between the source location and the delivery destination, or in the general vicinity of the source location or delivery destination, from a commercial, governmental, or national weather service, ground based vehicles, water based vehicles, etc.

Based on the source location, delivery destination, and current flight conditions, the example process queries a flight path data store to obtain a flight duration determined for the flight path between the source location and the delivery destination that corresponds with the determined current flight conditions, as in 710. As discussed above, multiple flight simulations between the source location and the delivery destination along the flight path may be performed, each with different flight conditions, and a flight duration determined.

Based at least in part on the flight duration determined from the flight path data store, an aerial delivery time estimate is determined, as in 712. The aerial delivery time estimate may be representative of a total estimated time that is estimated to elapse between receipt of a request for aerial delivery of the item to a completion of the aerial delivery of the item. The aerial delivery time estimate may include, among other times, the flight duration determined for the flight path corresponding to the current flight conditions, a preparation time to prepare the item for aerial transport by the aerial vehicle, a delivery completion time to complete a delivery of the item at the delivery destination, an inventory condition, etc. The preparation time may include time required to retrieve an instance of the item from the inventory store, pack the item in a container, load the item and/or the container containing the item onto an aerial vehicle, complete a pre-flight safety check for the aerial vehicle, etc. The delivery completion time may include time necessary for the aerial vehicle to descend to the delivery destination, decouple or release the item or the container containing the item, ascend from the delivery destination, etc. An inventory condition time may be a weighting factor that is added to the aerial delivery time estimate to account for load balancing among multiple fulfillment centers, etc. For example, if one fulfillment center is running low on inventory of the item, it may add time to the aerial delivery time. As another example, if the source location is at a high or full work capacity such that additional work may take extra time to complete, additional time may be added as inventory conditions to the aerial delivery time estimate.

If there is more than one flight path to the delivery destination that may be used to deliver the item to the delivery destination (e.g., instances of the item are maintained at multiple source locations with corresponding flight paths to the delivery destination), a flight path may be selected based on one or more optimization parameters, as in 713. For example, a flight path having the shortest aerial delivery time estimate may be selected, a flight path that requires the least amount of energy consumption may be selected, a flight path that passes over or does not pass over a particular type of terrain may be selected, etc. For the selected flight path, a determination is made as to whether the aerial delivery time estimate is below a threshold, as in 714. The threshold may be any defined duration (e.g., ten minutes, twenty minutes, thirty minutes, one hour, etc.). If it is determined that the aerial delivery time estimate is not below the threshold, an aerial delivery option without a promised delivery timeframe may be returned or presented to the customer, as in 718. Alternatively, the aerial delivery option may not be presented to the user.

If it is determined that the aerial flight path time estimate is below the threshold, an aerial delivery option for the item and a promised delivery timeframe is returned or presented to the customer, as in 716. As discussed above, the promised delivery timeframe may be a set time or promise by which the item will be delivered to the delivery destination following a request for delivery of the item (e.g., following a purchase, lease, borrowing of the item). In other implementations, the promised delivery timeframe may be determined based on the aerial delivery time estimate determined for the aerial transport of the item to the delivery destination based on the flight conditions. For example, the promised delivery timeframe may be the aerial delivery time estimate. In another example, the promised delivery timeframe may be the aerial delivery time estimate plus a buffer factor (e.g., five minutes, ten minutes, etc.).

In some implementations, a determination may be made as to whether a sufficient amount of actual flight path data for the flight path and the current flight conditions is stored in the flight path data store, as in 720. As discussed above, the flight path data store may store both simulated flight data for a flight path according to varying flight conditions and actual flight path data that includes actual flight conditions measured by the aerial vehicle during an actual flight along the flight path. A sufficient amount may be any defined amount of actual flight path data. For example, in some implementations, a sufficient amount may be one instance of an actual flight along the flight path with the corresponding flight conditions. In other implementations, a sufficient amount may require more than one set of actual flight path data under the flight conditions.

If it is determined that a sufficient amount of actual flight path data that corresponds to the current flight conditions along the flight path is not stored in the flight path data store, the example process completes, as in 726. However, if it is determined that a sufficient amount of actual flight path data that corresponds to the current flight conditions is stored in the flight path data store, an estimated time until delivery of the item may be determined, as in 722, and the estimated time until delivery may be presented to the customer, as in 724. An estimated time until delivery may be determined based on the current flight conditions, the process or progress of delivery of the item to the delivery destination, etc., and may be estimated based on the actual flight conditions corresponding to the flight path and the current flight conditions. In some implementations, an estimate time until delivery may be determined and presented based solely on simulated flight path data and/or based on a combination of actual flight path data and simulated flight path data. In such implementations, actual flight path data may not be required to determine an estimated time until delivery. The presented estimated time until delivery may be periodically updated as delivery of the item to the delivery destination progresses.

Figure 8:
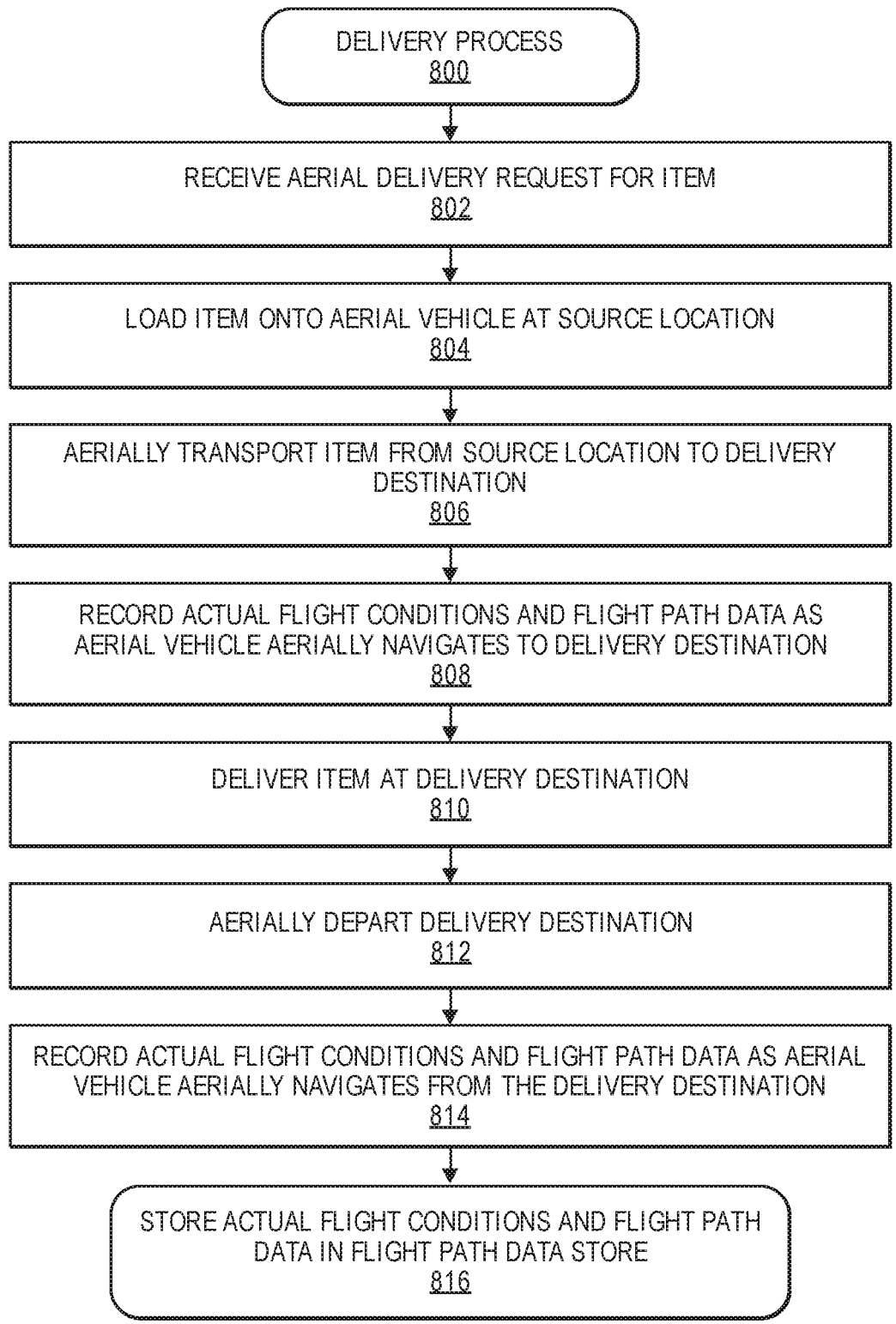
FIG. 8 is a flow diagram of an example delivery process, in accordance with implementations of the present disclosure.

FIG. 8 is a flow diagram of an example delivery process 800, in accordance with implementations of the present disclosure. The example process 800 begins upon receipt of a request for aerial delivery of an item from a source location to a delivery destination, as in 802. A request for aerial delivery may be part of a purchase of an item and/or a request from a seller of an item to have the item aerially delivered on behalf of the seller.

Upon receipt of the request for aerial delivery of the item, the item is loaded onto the aerial vehicle at the source location, as in 804. In some implementations, the item may be loaded directly into or onto the aerial vehicle. Alternatively, the item may be placed in a container that is then engaged by or loaded onto or into the aerial vehicle.

Upon engagement of the item by the aerial vehicle, the aerial vehicle aerially transports the item along the flight path between the source location and the delivery destination, as in 806. As the aerial vehicle navigates the flight path, the aerial vehicle records actual flight conditions and other flight path data, as in 808. For example, the aerial vehicle may include one or more sensors (e.g., thermometer, barometer, pitot tube, etc.) that are used to measure actual current flight conditions as experienced by the aerial vehicle as the aerial vehicle aerially navigates along the flight path.

When the aerial vehicle reaches the delivery destination, the aerial vehicle completes a delivery of the item to the delivery destination, as in 810. A variety of techniques may be used to complete delivery of the item. For example, a container engaged by the aerial vehicle that contains the item may be disengaged by the aerial vehicle and left at the delivery destination, thereby completing a delivery of the item.

After completing delivery of the item at the delivery destination, the aerial vehicle aerially departs the delivery destination, as in 812. As the aerial vehicle departs and aerially navigates away from the delivery destination, for example back to the source location, to another delivery destination, and/or to another location, the aerial vehicle may continue to record flight data, including actual flight conditions as experienced by the aerial vehicle, as in 814. The recorded flight data, including the flight path and corresponding actual flight conditions may be transmitted from the aerial vehicle to one or more computing resources, associated with the flight path(s) and stored in the flight path lookup table maintained in the flight path data store, as in 816.

By measuring and recording actual flight path data, the flight path data store and the simulated flight data may be updated with actual information that may then be used in the future to determine estimated flight durations based on flight conditions.

Figure 9:
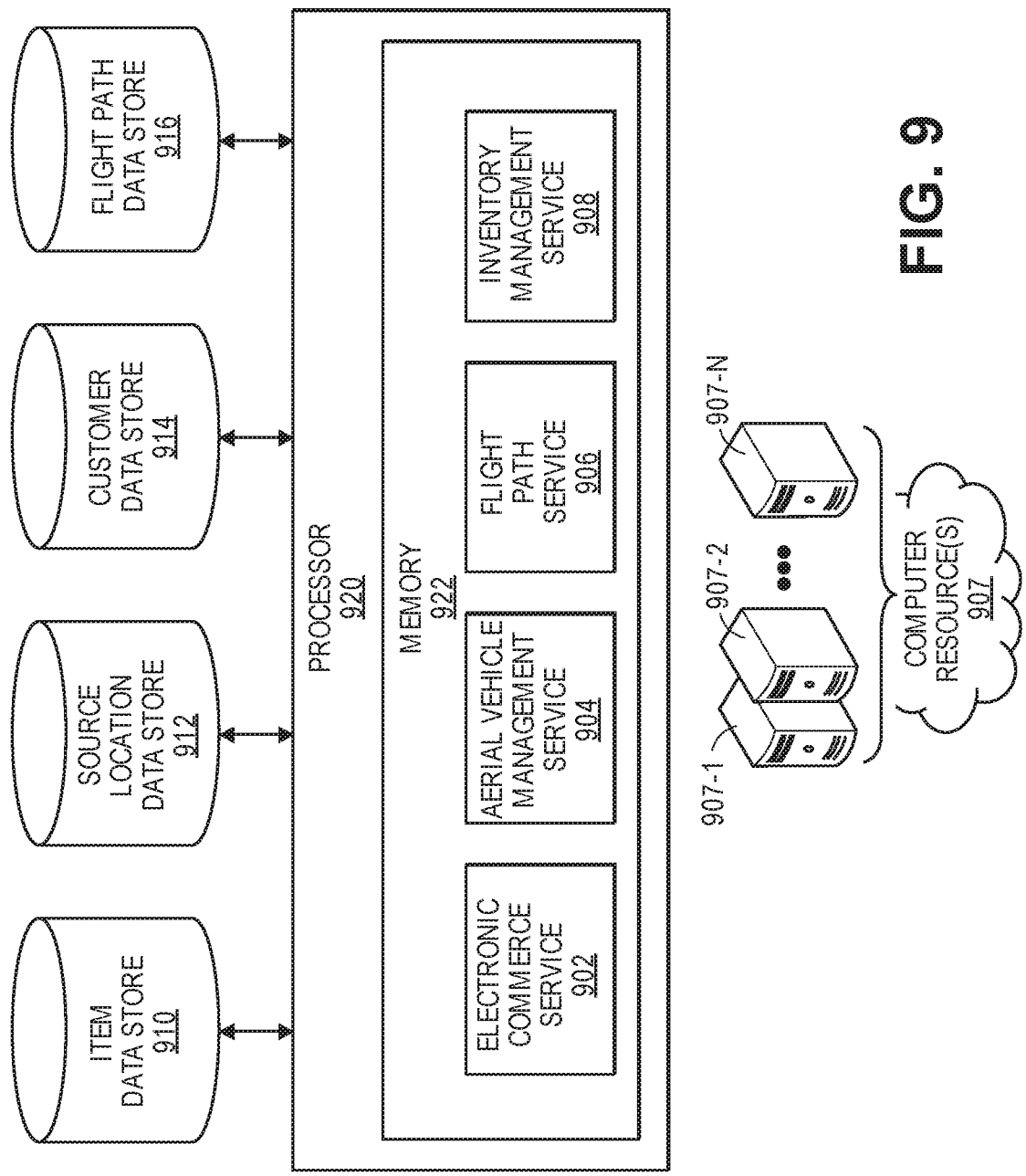
FIG. 9 is a block diagram of components of one system for activating areas for a merchant delivery service, in accordance with implementations of the present disclosure.

FIG. 9 is a block diagram of components of one computer resource 907 that may perform or provide the systems and methods, in accordance with implementations of the present disclosure. The computing resources 907 may form a portion of a network-accessible computing platform implemented as a computing infrastructure of processors, storage, software, data access, and other components that is maintained and accessible via a network, such as the Internet. Services, such as the electronic commerce service 902, the aerial vehicle management service 904, flight path service 906, and/or inventory management service enabled by the computing resources 907, do not require that customers and/or other sellers have knowledge of the physical location and configuration of the computer resources 907 that deliver the services. Customers may utilize one or more computing devices, such as computers, laptops, tablets, smartphones, and/or other hardware or software to communicatively couple to the computing resources 907 via a network which may represent wired technologies (e.g., wires, USB, fiber optic cable, etc.), wireless technologies (e.g., RF, cellular, satellite, Bluetooth, etc.), and/or other connection technologies. Likewise, the aerial vehicles discussed herein, and illustrated by example in FIG. 10, may be configured or capable of communicating with the computing resources 907 via a network.

As illustrated, the remote computing resources 907 may include one or more servers, such as servers 907-1, 907-2, 907-3 . . . 907-N. These servers 907-1-907-N may be arranged in any number of ways, such as server farms, stacks, and the like, that are commonly used in data centers. Furthermore, the servers 907-1-907-N may include one or more processors 920 and memory 922 which may store the electronic commerce service 902, aerial vehicle management service 904, flight path service 906 and/or the inventory management service 908 and execute one or more of the processes or features discussed herein.

The electronic commerce service 902 may include one or more components that operate to perform one or more of the processes or features described herein. For example, the electronic commerce service 902 may include and/or manage a website that includes multiple webpages that offer items for sale, lease, rental, borrowing, etc. Alternatively, or in addition thereto, the electronic commerce service 902 may communicate with one or more of the aerial vehicle management service 904, flight path service 906, and/or the inventory management service 908 to facilitate one or more of the processes discussed herein.

The aerial vehicle management service 904 may be configured to communicate with each of a plurality of aerial vehicles to coordinate flights of the aerial vehicles, plan flight paths of the aerial vehicles, etc. The flight path service may work in conjunction with the aerial vehicle management service 904, simulate flights of the aerial vehicles along various flight paths and according to various flight conditions, receive and store actual flight path data recorded from the aerial vehicles during operation, maintain the flight path data store 916, as discussed herein, etc. The inventory management service may communicate with each source location and maintain inventory information for each source location. One or more of the electronic commerce service 902, the aerial vehicle management service 904, the flight path service 906, and/or the inventory management service 908 may also be configured to access one or more of the item data store 910, source location data store 912, customer data store 914, and/or the flight path data store 916.

The item data store 910 may store item information corresponding to items stored at various source locations. The item information may include, among other things, the dimensions of the items, the weight of the items, whether the item is eligible for item delivery, the fragility of the item, the source locations that maintain inventory of the item, etc. The source location data store 912 may include information corresponding to each source location including, but not limited to, the inventory items maintained at the source location, the number, size, and/or configuration of aerial vehicles, such as unmanned aerial vehicles operating from the source location, the geographic position of the source location, etc. The customer data store 914 may maintain information relevant to each customer, for example customers of the electronic commerce service 902. Customer information may include one or more designated delivery destinations, default delivery destinations, preferred modes of delivery, purchase history, etc. The flight path data store 916 may store simulated and/or actual flight path data as discussed above.

As will be appreciated, additional or fewer components may be included in the example computer resources 907 and the ones discussed herein are provided as examples and for discussion purposes only. For example, in some implementations, ordering service that manages customer orders may be included, and/or a payment service that manages payment for items requested by customers may be included in the computing resources 907. Likewise, in other implementations, some or all of the components may be combined into a single component.

Figure 10:
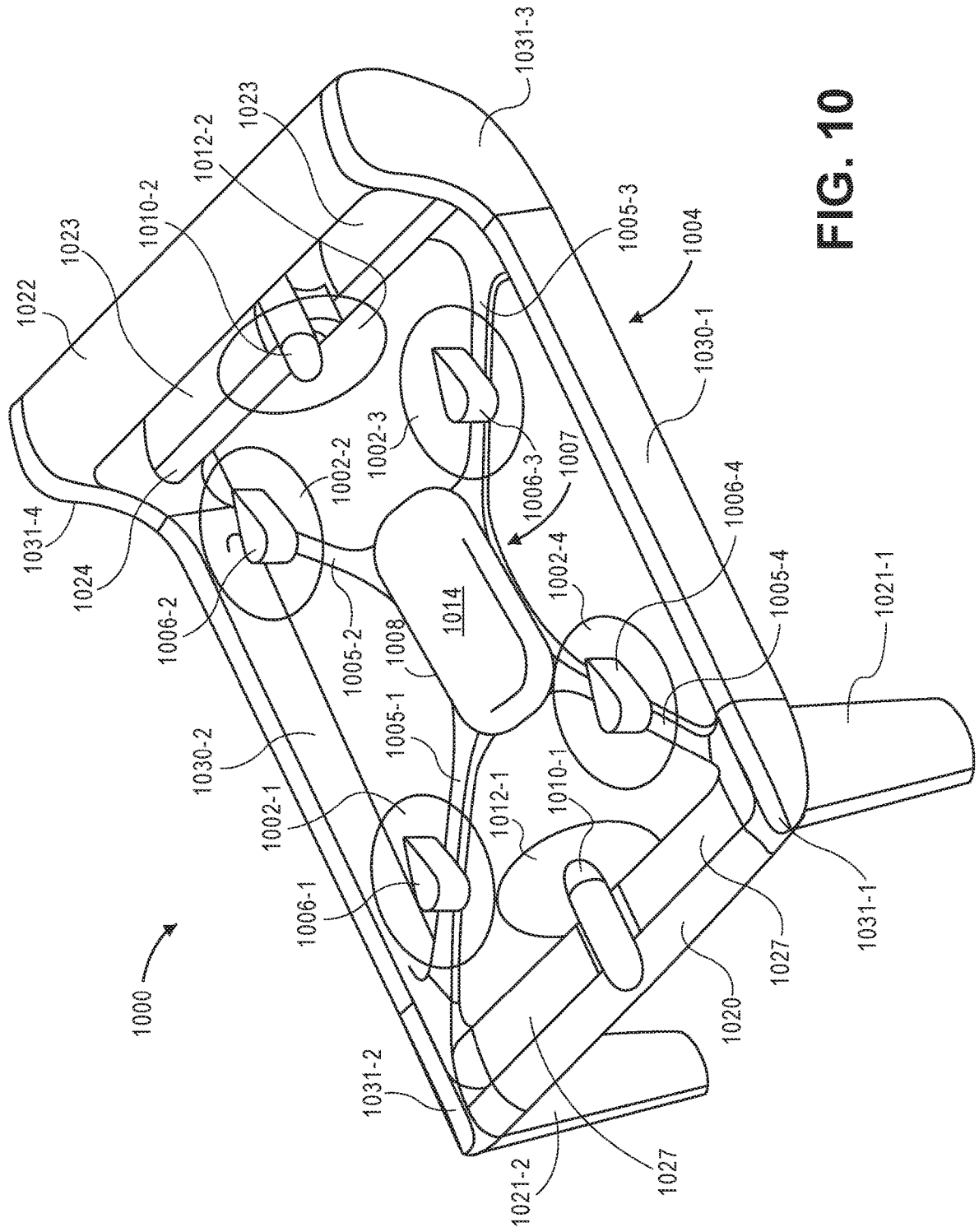
FIG. 10 is an example aerial vehicle that may be utilized with the implementations described herein.

FIG. 10 illustrates a view of an aerial vehicle 1000, such as an unmanned aerial vehicle, that may be utilized with the disclosed implementations. As illustrated, the aerial vehicle 1000 includes a perimeter frame 1004 that includes a front wing 1020, a lower rear wing 1024, an upper rear wing 1022, and two horizontal side rails 1030-1, 1030-2. The horizontal side rails 1030 are coupled to opposing ends of the front wing 1020 and opposing ends of the upper rear wing 1022 and lower rear wing 1024. In some implementations, the coupling may be with a corner junction, such as the front left corner junction 1031-1, the front right corner junction 1031-2, the rear left corner junction 1031-3, the rear right corner junction 1031-4. In such an example, the corner junctions are also part of the perimeter frame 1004.

The components of the perimeter frame 1004, such as the front wing 1020, lower rear wing 1024, upper rear wing 1022, side rails 1030-1, 1030-2, and corner junctions 1031 may be formed of any one or more suitable materials, such as graphite, carbon fiber, aluminum, titanium, etc., or any combination thereof. In the illustrated example, the components of the perimeter frame 1004 of the aerial vehicle 1000 are each formed of carbon fiber and joined at the corners using corner junctions 1031. The components of the perimeter frame 1004 may be coupled using a variety of techniques. For example, if the components of the perimeter frame 1004 are carbon fiber, they may be fitted together and joined using secondary bonding, a technique known to those of skill in the art. In other implementations, the components of the perimeter frame 1004 may be affixed with one or more attachment mechanisms, such as screws, rivets, latches, quarter-turn fasteners, etc., or otherwise secured together in a permanent or removable manner.

The front wing 1020, lower rear wing 1024, and upper rear wing 1022 are positioned in a tri-wing configuration and each wing provides lift to the aerial vehicle 1000 when the aerial vehicle is moving in a direction that includes a horizontal component. For example, the wings may each have an airfoil shape that causes lift due to the airflow passing the wings during horizontal flight.

Opposing ends of the front wing 1020 may be coupled to a corner junction 1031, such as the front left corner junction 1031-1 and front right corner junction 1031-2. In some implementations, the front wing may include one or more flaps 1027, or ailerons, that may be used to adjust the pitch, yaw, and/or roll of the aerial vehicle 1000 alone or in combination with the lifting motors 1006, lifting propellers 1002, thrusting motors 1010, thrusting propellers 1012, and/or other flaps on the rear wings. In some implementations, the flaps 1027 may also be used as a protective shroud to further hinder access to the lifting propellers 1002 by objects external to the aerial vehicle 1000. For example, when the aerial vehicle 1000 is moving in a vertical direction or hovering, the flaps 1027 may be extended to increase the height of the protective barrier around a portion of the lifting propellers 1002.

In some implementations, the front wing 1020 may include two or more pairs of flaps 1027. In other implementations, for example if there is no front thrusting motor 1010-1, the front wing 1020 may only include a single flap 1027 that extends substantially the length of the front wing 1020. If the front wing 1020 does not include flaps 1027, the lifting motors 1006 and lifting propellers 1002, thrusting motors 1010, thrusting propellers 1012 and/or flaps of the rear wings may be utilized to control the pitch, yaw, and/or roll of the aerial vehicle 1000 during flight.

Opposing ends of the lower rear wing 1024 may be coupled to a corner junction 1031, such as the rear left corner junction 1031-3 and rear right corner junction 1031-4. In some implementations, the lower rear wing may include one or more flaps 1023, or ailerons, that may be used to adjust the pitch, yaw and/or roll of the aerial vehicle 1000 alone or in combination with the lifting motors 1006, lifting propellers 1002, thrusting motors 1010, thrusting propellers 1012, and/or the flaps 1027 of the front wing. In some implementations, the flaps 1023 may also be used as a protective shroud to further hinder access to the lifting propellers 1002 by objects external to the aerial vehicle 1000. For example, when the aerial vehicle 1000 is moving in a vertical direction or hovering, the flaps 1023 may be extended, similar to the extending of the front flaps 1027 of the front wing 1020.

In some implementations, the rear wing 1024 may include two or more flaps 1023. In other implementations, for example if there is no rear thrusting motor 1010-2 mounted to the lower rear wing, the rear wing 1024 may only include a single flap 1023 that extends substantially the length of the lower rear wing 1024. In other implementations, if the lower rear wing includes two thrusting motors, the lower rear wing may be configured to include three flaps 1023, one on either end of the lower rear wing 1024, and one between the two thrusting motors mounted to the lower rear wing 1024.

Opposing ends of the upper rear wing 1022 may be coupled to a corner junction 1031, such as the rear left corner junction 1031-3 and rear right corner junction 1031-4. In some implementations, like the lower rear wing, the upper rear wing 1022 may include one or more flaps (not shown) or ailerons, that may be used to adjust the pitch, yaw and/or roll of the aerial vehicle 1000 alone or in combination with the lifting motors 1006, lifting propellers 1002, thrusting motors 1010, thrusting propellers 1012, and/or other flaps of other wings. In some implementations, the flaps may also be used as a protective shroud to further hinder access to the lifting propellers 1002 by objects external to the aerial vehicle 1000. For example, when the aerial vehicle 1000 is moving in a vertical direction or hovering, the flaps may be extended, similar to the extending of the front flaps 1027 of the front wing 1020 or the flaps 1023 of the lower rear wing.

The front wing 1020, lower rear wing 1024, and upper rear wing 1022 may be positioned and sized proportionally to provide stability to the aerial vehicle while the aerial vehicle 1000 is moving in a direction that includes a horizontal component. For example, the lower rear wing 1024 and the upper rear wing 1022 are stacked vertically such that the vertical lift vectors generated by each of the lower rear wing 1024 and upper rear wing 1022 are close together, which may be destabilizing during horizontal flight. In comparison, the front wing 1020 is separated from the rear wings longitudinally such that the vertical lift vector generated by the front wing 1020 acts together with the vertical lift vectors of the lower rear wing 1024 and the upper rear wing 1022, providing efficiency, stabilization and control.

In some implementations, to further increase the stability and control of the aerial vehicle 1000, one or more winglets 1021, or stabilizer arms, may also be coupled to and included as part of the perimeter frame 1004. The winglets 1021 may extend in a downward direction approximately perpendicular to the front wing 1020 and side rails 1030. Likewise, the two rear corner junctions 1031-3, 1031-4 are also formed and operate as winglets providing additional stability and control to the aerial vehicle 1000 when the aerial vehicle 1000 is moving in a direction that includes a horizontal component.

The winglets 1021 and the rear corner junctions 1031 may have dimensions that are proportional to the length, width, and height of the aerial vehicle 1000 and may be positioned based on the approximate center of gravity of the aerial vehicle 1000 to provide stability and control to the aerial vehicle 1000 during horizontal flight. For example, in one implementation, the aerial vehicle 1000 may be approximately 64.75 inches long from the front of the aerial vehicle 1000 to the rear of the aerial vehicle 1000 and approximately 60.00 inches wide. In such a configuration, the front wing 1020 has dimensions of approximately 60.00 inches by approximately 7.87 inches. The lower rear wing 1024 has dimensions of approximately 60.00 inches by approximately 9.14 inches. The upper rear wing 1022 has dimensions of approximately 60.00 inches by approximately 5.47 inches. The vertical separation between the lower rear wing and the upper rear wing is approximately 21.65 inches. The winglets 1021 are approximately 6.40 inches wide at the corner junction with the perimeter frame of the aerial vehicle, approximately 5.91 inches wide at the opposing end of the winglet and approximately 23.62 inches long. The rear corner junctions 1031-3, 1031-4 are approximately 9.14 inches wide at the end that couples with the lower rear wing 1024, approximately 8.04 inches wide at the opposing end, and approximately 21.65 inches long. The overall weight of the aerial vehicle 1000 is approximately 50.00 pounds.

Coupled to the interior of the perimeter frame 1004 is a central frame 1007. The central frame 1007 includes a hub 1008 and motor arms 1005 that extend from the hub 1008 and couple to the interior of the perimeter frame 1004. In this example, there is a single hub 1008 and four motor arms 1005-1, 1005-2, 1005-3, and 1005-4. Each of the motor arms 1005 extend from approximately a corner of the hub 1008 and couple or terminate into a respective interior corner of the perimeter frame. In some implementations, each motor arm 1005 may couple into a corner junction 1031 of the perimeter frame 1004. Like the perimeter frame 1004, the central frame 1007 may be formed of any suitable material, such as graphite, carbon fiber, aluminum, titanium, etc., or any combination thereof. In this example, the central frame 1007 is formed of carbon fiber and joined at the corners of the perimeter frame 1004 at the corner junctions 1031. Joining of the central frame 1007 to the perimeter frame 1004 may be done using any one or more of the techniques discussed above for joining the components of the perimeter frame 1004.

Lifting motors 1006 are coupled at approximately a center of each motor arm 1005 so that the lifting motor 1006 and corresponding lifting propeller 1002 are within the substantially rectangular shape of the perimeter frame 1004. In one implementation, the lifting motors 1006 are mounted to an underneath or bottom side of each motor arm 1005 in a downward direction so that the propeller shaft of the lifting motor that mounts to the lifting propeller 1002 is facing downward. In other implementations, as illustrated in FIG. 10, the lifting motors 1006 may be mounted to a top of the motor arms 1005 in an upward direction so that the propeller shaft of the lifting motor that mounts to the lifting propeller 1002 is facing upward. In this example, there are four lifting motors 1006-1, 1006-2, 1006-3, 1006-4, each mounted to an upper side of a respective motor arm 1005-1, 1005-2, 1005-3, and 1005-4.

In some implementations, multiple lifting motors may be coupled to each motor arm 1005. For example, while FIG. 10 illustrates a quad-copter configuration with each lifting motor mounted to a top of each motor arm, a similar configuration may be utilized for an octo-copter. For example, in addition to mounting a motor 1006 to an upper side of each motor arm 1005, another lifting motor may also be mounted to an underneath side of each motor arm 1005 and oriented in a downward direction. In another implementation, the central frame may have a different configuration, such as additional motor arms. For example, eight motor arms may extend in different directions and a lifting motor may be mounted to each motor arm.

The lifting motors may be any form of motor capable of generating enough rotational speed with the lifting propellers 1002 to lift the aerial vehicle 1000 and any engaged payload, thereby enabling aerial transport of the payload.

Mounted to each lifting motor 1006 is a lifting propeller 1002. The lifting propellers 1002 may be any form of propeller (e.g., graphite, carbon fiber) and of a size sufficient to lift the aerial vehicle 1000 and any payload engaged by the aerial vehicle 1000 so that the aerial vehicle 1000 can navigate through the air, for example, to deliver a payload to a delivery location. For example, the lifting propellers 1002 may each be carbon fiber propellers having a dimension or diameter of twenty-four inches. While the illustration of FIG. 10 shows the lifting propellers 1002 all of a same size, in some implementations, one or more of the lifting propellers 1002 may be different sizes and/or dimensions. Likewise, while this example includes four lifting propellers 1002-1, 1002-2, 1002-3, 1002-4, in other implementations, more or fewer propellers may be utilized as lifting propellers 1002. Likewise, in some implementations, the lifting propellers 1002 may be positioned at different locations on the aerial vehicle 1000. In addition, alternative methods of propulsion may be utilized as "motors" in implementations described herein. For example, fans, jets, turbojets, turbo fans, jet engines, internal combustion engines, and the like may be used (either with propellers or other devices) to provide lift for the aerial vehicle.

In addition to the lifting motors 1006 and lifting propellers 1002, the aerial vehicle 1000 may also include one or more thrusting motors 1010 and corresponding thrusting propellers 1012. The thrusting motors and thrusting propellers may be the same or different than the lifting motors 1006 and lifting propellers 1002. For example, in some implementations, the thrusting propellers may be formed of carbon fiber and be approximately eighteen inches long. In other implementations, the thrusting motors may utilize other forms of propulsion to propel the aerial vehicle. For example, fans, jets, turbojets, turbo fans, jet engines, internal combustion engines, and the like may be used (either with propellers or with other devices) as the thrusting motors.

The thrusting motors and thrusting propellers may be oriented at approximately ninety degrees with respect to the perimeter frame 1004 and central frame 1007 of the aerial vehicle 1000 and utilized to increase the efficiency of flight that includes a horizontal component. For example, when the aerial vehicle 1000 is traveling in a direction that includes a horizontal component, the thrusting motors may be engaged to provide a horizontal thrust force via the thrusting propellers to propel the aerial vehicle 1000 horizontally. As a result, the speed and power utilized by the lifting motors 1006 may be reduced. Alternatively, in selected implementations, the thrusting motors may be oriented at an angle greater or less than ninety degrees with respect to the perimeter frame 1004 and the central frame 1007 to provide a combination of thrust and lift.

In the example illustrated in FIG. 10, the aerial vehicle 1000 includes two thrusting motors 1010-1, 1010-2 and corresponding thrusting propellers 1012-1, 1012-2. Specifically, in the illustrated example, there is a front thrusting motor 1010-1 coupled to and positioned near an approximate mid-point of the front wing 1020. The front thrusting motor 1010-1 is oriented such that the corresponding thrusting propeller 1012-1 is positioned inside the perimeter frame 1004. The second thrusting motor is coupled to and positioned near an approximate mid-point of the lower rear wing 1024. The rear thrusting motor 1010-2 is oriented such that the corresponding thrusting propeller 1012-2 is positioned inside the perimeter frame 1004.

While the example illustrated in FIG. 10 illustrates the aerial vehicle with two thrusting motors 1010 and corresponding thrusting propellers 1012, in other implementations, there may be fewer or additional thrusting motors and corresponding thrusting propellers. For example, in some implementations, the aerial vehicle 1000 may only include a single rear thrusting motor 1010 and corresponding thrusting propeller 1012. In another implementation, there may be two thrusting motors and corresponding thrusting propellers mounted to the lower rear wing 1024. In such a configuration, the front thrusting motor 1010-1 may be included or omitted from the aerial vehicle 1000. Likewise, while the example illustrated in FIG. 10 shows the thrusting motors oriented to position the thrusting propellers inside the perimeter frame 1004, in other implementations, one or more of the thrusting motors 1010 may be oriented such that the corresponding thrusting propeller 1012 is oriented outside of the perimeter frame 1004.

The perimeter frame 1004 provides safety for objects foreign to the aerial vehicle 1000 by inhibiting access to the lifting propellers 1002 from the side of the aerial vehicle 1000, provides protection to the aerial vehicle 1000, and increases the structural integrity of the aerial vehicle 1000. For example, if the aerial vehicle 1000 is traveling horizontally and collides with a foreign object (e.g., wall, building), the impact between the aerial vehicle 1000 and the foreign object will be with the perimeter frame 1004, rather than a propeller. Likewise, because the frame is interconnected with the central frame 1007, the forces from the impact are dissipated across both the perimeter frame 1004 and the central frame 1007.

The perimeter frame 1004 also provides a surface upon which one or more components of the aerial vehicle 1000 may be mounted. Alternatively, or in addition thereto, one or more components of the aerial vehicle may be mounted or positioned within the cavity of the portions of the perimeter frame 1004. For example, one or more antennas may be mounted on or in the front wing 1020. The antennas may be used to transmit and/or receive wireless communications. For example, the antennas may be utilized for Wi-Fi, satellite, near field communication ("NFC"), cellular communication, or any other form of wireless communication. Other components, such as cameras, time of flight sensors, accelerometers, inclinometers, distance-determining elements, thermometers, pitot tubes, gimbals, Global Positioning System (GPS) receiver/transmitter, radars, illumination elements, speakers, and/or any other component or sensor of the aerial vehicle 1000 or the aerial vehicle control system (discussed below), etc., may likewise be mounted to or in the perimeter frame 1004. Likewise, identification or reflective identifiers may be mounted to the perimeter frame 1004 to aid in the identification of the aerial vehicle 1000.

In some implementations, the perimeter frame 1004 may also include a permeable material (e.g., mesh, screen) that extends over the top and/or lower surface of the perimeter frame 1004 enclosing the central frame, lifting motors, and/or lifting propellers.

An aerial vehicle control system 1014 is also mounted to the central frame 1007. In this example, the aerial vehicle control system 1014 is mounted to the hub 1008 and is enclosed in a protective barrier. The protective barrier may provide the control system 1014 weather protection so that the aerial vehicle 1000 may operate in rain and/or snow without disrupting the control system 1014. In some implementations, the protective barrier may have an aerodynamic shape to reduce drag when the aerial vehicle is moving in a direction that includes a horizontal component. The protective barrier may be formed of any materials including, but not limited to, graphite-epoxy, Kevlar, and/or fiberglass. In some implementations, multiple materials may be utilized. For example, Kevlar may be utilized in areas where signals need to be transmitted and/or received.

Likewise, the aerial vehicle 1000 includes one or more power modules. The power modules may be positioned inside the cavity of the side rails 1030-1, 1030-2. In other implementations, the power modules may be mounted or positioned at other locations of the aerial vehicle. The power modules for the aerial vehicle may be in the form of battery power, solar power, gas power, super capacitor, fuel cell, alternative power generation source, or a combination thereof. For example, the power modules may each be a 6000 mAh lithium-ion polymer battery, or polymer lithium ion (Li-poly, Li-Pol, LiPo, LIP, PLI or Lip) battery. The power module(s) are coupled to and provide power for the aerial vehicle control system 1014, the lifting motors 1006, the thrusting motors 1010, and the payload engagement mechanism.

In some implementations, one or more of the power modules may be configured such that it can be autonomously removed and/or replaced with another power module while the aerial vehicle is landed or in flight. For example, when the aerial vehicle lands at a location, such as a source location, the aerial vehicle may engage with a charging member at the location that will recharge the power module.

As mentioned above, the aerial vehicle 1000 may also include a payload engagement mechanism. The payload engagement mechanism may be configured to engage and disengage items and/or containers that hold items (payload). In this example, the payload engagement mechanism is positioned beneath and coupled to the hub 1008 of the frame 1004 of the aerial vehicle 1000. The payload engagement mechanism may be of any size sufficient to securely engage and disengage a payload. In other implementations, the payload engagement mechanism may operate as the container in which it contains item(s). The payload engagement mechanism communicates with (via wired or wireless communication) and is controlled by the aerial vehicle control system 1014. Example payload engagement mechanisms are described in co-pending patent application Ser. No. 14/502,707, filed Sep. 30, 2014, titled "UNMANNED AERIAL VEHICLE DELIVERY SYSTEM," the subject matter of which is incorporated by reference herein in its entirety.

Figure 11:
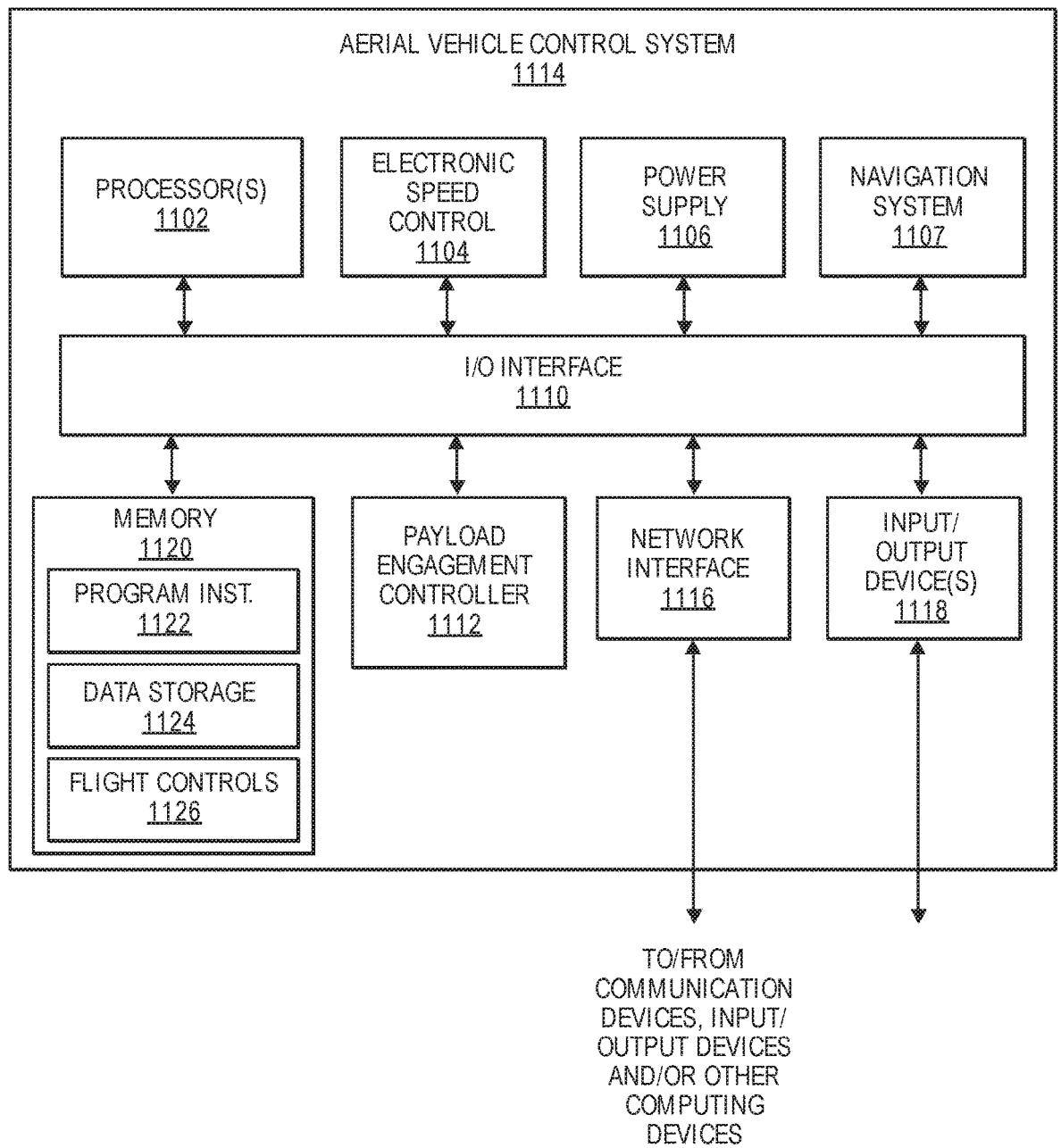
FIG. 11 is an example aerial vehicle control system that may be utilized with the example aerial vehicle discussed with respect to FIG. 10.

FIG. 11 is a block diagram illustrating an example aerial vehicle control system 1114 that may be utilized by the aerial vehicle discussed with respect to FIG. 10, in accordance with disclosed implementations. In various examples, the block diagram may be illustrative of one or more aspects of the aerial vehicle control system 1114 that may be used to implement the various systems and methods discussed herein and/or to control operation of the aerial vehicles described herein. In the illustrated implementation, the aerial vehicle control system 1114 includes one or more processors 1102, coupled to a memory, e.g., a non-transitory computer readable storage medium 1120, via an input/output (I/O) interface 1110. The aerial vehicle control system 1114 may also include electronic speed controls 1104 (ESCs), power supply modules 1106, a navigation system 1107, and/or a payload engagement controller 1112. In some implementations, the navigation system 1107 may include an inertial measurement unit (IMU). The aerial vehicle control system 1114 may also include a network interface 1116, and one or more input/output devices 1118.

In various implementations, the aerial vehicle control system 1114 may be a uniprocessor system including one processor 1102, or a multiprocessor system including several processors 1102 (e.g., two, four, eight, or another suitable number). The processor(s) 1102 may be any suitable processor capable of executing instructions. For example, in various implementations, the processor(s) 1102 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 1102 may commonly, but not necessarily, implement the same ISA.

The non-transitory computer readable storage medium 1120 may be configured to store executable instructions, data, flight paths, flight control parameters, and/or data items accessible by the processor(s) 1102. In various implementations, the non-transitory computer readable storage medium 1120 may be implemented using any suitable memory technology, such as static random access memory (SRAM), synchronous dynamic RAM (SDRAM), nonvolatile/Flash-type memory, or any other type of memory. In the illustrated implementation, program instructions and data implementing desired functions, such as those described herein, are shown stored within the non-transitory computer readable storage medium 1120 as program instructions 1122, data storage 1124 and flight controls 1126, respectively. In other implementations, program instructions, data, and/or flight controls may be received, sent, or stored upon different types of computer-accessible media, such as non-transitory media, or on similar media separate from the non-transitory computer readable storage medium 1120 or the aerial vehicle control system 1114. Generally speaking, a non-transitory, computer readable storage medium may include storage media or memory media such as magnetic or optical media, e.g., disk or CD/DVD-ROM, coupled to the aerial vehicle control system 1114 via the I/O interface 1110. Program instructions and data stored via a non-transitory computer readable storage medium may be transmitted by transmission media or signals, such as electrical, electromagnetic, or digital signals, which may be conveyed via a communication medium such as a network and/or a wireless link, such as may be implemented via the network interface 1116.

In one implementation, the I/O interface 1110 may be configured to coordinate I/O traffic between the processor(s) 1102, the non-transitory computer readable storage medium 1120, and any peripheral devices, the network interface 1116 or other peripheral interfaces, such as input/output devices 1118. In some implementations, the I/O interface 1110 may perform any necessary protocol, timing or other data transformations to convert data signals from one component (e.g., non-transitory computer readable storage medium 1120) into a format suitable for use by another component (e.g., processor(s) 1102). In some implementations, the I/O interface 1110 may include support for devices attached through various types of peripheral buses, such as a variant of the Peripheral Component Interconnect (PCI) bus standard or the Universal Serial Bus (USB) standard, for example. In some implementations, the function of the I/O interface 1110 may be split into two or more separate components, such as a north bridge and a south bridge, for example. Also, in some implementations, some or all of the functionality of the I/O interface 1110, such as an interface to the non-transitory computer readable storage medium 1120, may be incorporated directly into the processor(s) 1102.

The ESCs 1104 communicate with the navigation system 1107 and adjust the rotational speed of each lifting motor and/or the thrusting motor to stabilize the aerial vehicle and guide the aerial vehicle along a determined flight path. The navigation system 1107 may include a GPS, indoor positioning system (IPS), IMU or other similar systems and/or sensors that can be used to navigate the aerial vehicle 1000 to and/or from a location. The payload engagement controller 1112 communicates with actuator(s) or motor(s) (e.g., a servo motor) used to engage and/or disengage items.

The network interface 1116 may be configured to allow data to be exchanged between the aerial vehicle control system 1114, other devices attached to a network, such as other computer systems (e.g., remote computing resources), and/or with aerial vehicle control systems of other aerial vehicles. For example, the network interface 1116 may enable wireless communication between the aerial vehicle that includes the aerial vehicle control system 1114 and an aerial vehicle control system that is implemented on one or more remote computing resources. For wireless communication, an antenna of an aerial vehicle or other communication components may be utilized. As another example, the network interface 1116 may enable wireless communication between numerous aerial vehicles. In various implementations, the network interface 1116 may support communication via wireless general data networks, such as a Wi-Fi network. For example, the network interface 1116 may support communication via telecommunications networks, such as cellular communication networks, satellite networks, and the like.

Input/output devices 1118 may, in some implementations, include one or more displays, imaging devices, thermal sensors, infrared sensors, time of flight sensors, accelerometers, pressure sensors, weather sensors, cameras, gimbals, landing gear, etc. Multiple input/output devices 1118 may be present and controlled by the aerial vehicle control system 1114. One or more of these sensors may be utilized to assist in landing, avoid obstacles during flight, and/or to measure and record flight conditions during flight.

As shown in FIG. 11, the memory may include program instructions 1122, which may be configured to implement the example routines and/or sub-routines described herein. The data storage 1124 may include various data stores for maintaining data items that may be provided for determining flight paths, landing, identifying locations for disengaging items, engaging/disengaging the thrusting motors, etc. In various implementations, the parameter values and other data illustrated herein as being included in one or more data stores may be combined with other information not described or may be partitioned differently into more, fewer, or different data structures. In some implementations, data stores may be physically located in one memory or may be distributed among two or more memories.

Those skilled in the art will appreciate that the aerial vehicle control system 1114 is merely illustrative and is not intended to limit the scope of the present disclosure. In particular, the computing system and devices may include any combination of hardware or software that can perform the indicated functions. The aerial vehicle control system 1114 may also be connected to other devices that are not illustrated, or instead may operate as a stand-alone system. In addition, the functionality provided by the illustrated components may, in some implementations, be combined in fewer components or distributed in additional components. Similarly, in some implementations, the functionality of some of the illustrated components may not be provided and/or other additional functionality may be available.

The computers, servers, devices, computing resources and the like described herein have the necessary electronics, software, memory, storage, databases, firmware, logic/state machines, microprocessors, communication links, displays or other visual or audio user interfaces, printing devices, and any other input/output interfaces to provide any of the functions or services described herein and/or achieve the results described herein. Also, those of ordinary skill in the pertinent art will recognize that users of such computers, servers, devices and the like may operate a keyboard, keypad, mouse, stylus, touch screen, or other device or method to interact with the computers, servers, devices and the like, or to "select" a control, link, node, hub or any other aspect of the present disclosure.

Those of ordinary skill in the pertinent arts will understand that process steps described herein as being performed by an "electronic commerce service," an "aerial vehicle management service," a "flight path service," an "inventory management service" or like terms, may be automated steps performed by their respective computer systems, or implemented within software modules (or computer programs) executed by one or more general purpose computers.

The data and/or computer executable instructions, programs, firmware, software and the like (also referred to herein as "computer executable" components) described herein may be stored on a computer-readable medium that is within or accessible by computers or computer components such as the computing resources 907 and having sequences of instructions which, when executed by a processor (e.g., a central processing unit, or "CPU"), cause the processor to perform all or a portion of the functions, services and/or methods described herein. Such computer executable instructions, programs, software and the like may be loaded into the memory of one or more computers using a drive mechanism associated with the computer readable medium, such as a floppy drive, CD-ROM drive, DVD-ROM drive, network interface, or the like, or via external connections.

Some implementations of the systems and methods of the present disclosure may also be provided as a computer executable program product including a non-transitory machine-readable storage medium having stored thereon instructions (in compressed or uncompressed form) that may be used to program a computer (or other electronic device) to perform processes or methods described herein. The machine-readable storage medium may include, but is not limited to, hard drives, floppy diskettes, optical disks, CD-ROMs, DVDs, ROMs, RAMs, erasable programmable ROMs ("EPROM"), electrically erasable programmable ROMs ("EEPROM"), flash memory, magnetic or optical cards, solid-state memory devices, or other types of media/machine-readable medium that may be suitable for storing electronic instructions. Further, implementations may also be provided as a computer executable program product that includes a transitory machine-readable signal (in compressed or uncompressed form). Examples of machine-readable signals, whether modulated using a carrier or not, may include, but are not limited to, signals that a computer system or machine hosting or running a computer program can be configured to access, or including signals that may be downloaded through the Internet or other networks.

Although the disclosure has been described herein using exemplary techniques, components, and/or processes for implementing the present disclosure, it should be understood by those skilled in the art that other techniques, components, and/or processes or other combinations and sequences of the techniques, components, and/or processes described herein may be used or performed that achieve the same function(s)

and/or result(s) described herein and which are included within the scope of the present disclosure.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, including but not limited to the flow charts shown in FIGS. 6-8, orders in which such methods or processes are presented are not intended to be construed as any limitation on the claimed inventions, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

The elements of a method, process, or algorithm described in connection with the implementations disclosed herein can be embodied directly in hardware, in a software module stored in one or more memory devices and executed by one or more processors, or in a combination of the two. A software module can reside in RAM, flash memory, ROM, EPROM, EEPROM, registers, a hard disk, a removable disk, a CD-ROM, a DVD-ROM or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly," "similar," or "substantially" as used herein, represent a value, amount, or characteristic close to the stated value, amount, or characteristic that still performs a desired function or achieves a desired result. For example, the terms "about," "approximately," "generally," "nearly," "similar," or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A computer-implemented method, comprising:
simulating a plurality of flights between a source location and a delivery destination along a flight path, wherein at least two of the plurality of flights are simulated with different flight conditions;
determining for each of the plurality of flights a flight duration;
storing in a data store each respective flight duration;
receiving a request from a customer computing device to view an electronic commerce page corresponding to an item available from an electronic commerce provider;
determining that the item is eligible for aerial delivery;
determining that the delivery destination corresponds to a customer associated with the customer computing device;
determining that the item is maintained in inventory at the source location;
determining current flight conditions between the source location and the delivery destination;
obtaining from the data store, an estimated flight duration corresponding to at least one flight duration stored in the data store for the flight path between the source location and the delivery destination, the estimated flight duration based at least in part on the current flight conditions;
determining an aerial delivery time estimate based at least in part on the estimated flight duration;
determining that the aerial delivery time estimate is below a threshold; and
sending for presentation by the customer computing device, an aerial delivery option with an aerial delivery time indicating a duration of time by which the item can be aerially delivered to the delivery destination upon receipt of a request from the customer computing device for an aerial delivery of the item to the delivery destination.

2. The computer-implemented method of claim 1, wherein a plurality of estimated flight durations are maintained in the data store for the flight path between the source location and the delivery destination, each of the plurality of estimated flight durations corresponding to a different combination of flight conditions.

3. The computer-implemented method of claim 1, further comprising:
   determining for each of the plurality of flights at least one of an energy consumption, or a terrain type over which the flight passes; and
   storing in the data store for the flight path, each respective energy consumption, terrain type, and flight condition.

4. The computer-implemented method of claim 3, wherein the flight conditions include at least one of a wind speed, a wind direction, a temperature, a time of day, a day of week, a precipitation level, a lumens level, an airspace congestion level along the flight path, a humidity level, or a barometric pressure level.

5. The computer-implemented method of claim 1, wherein the aerial delivery time estimate is further based at least in part on one or more of a preparation time to prepare the item for aerial transport, a delivery completion time to complete a delivery of the item at the delivery destination, or an inventory condition.

6. An aerial delivery service, comprising:
   one or more processors;
   a memory coupled to the one or more processors and storing program instructions that when executed by the one or more processors cause the one or more processors to at least:
      simulate a first flight between a source location and a delivery destination along a flight path with first flight conditions to determine a first flight duration;
      simulate a second flight between the source location and the delivery destination along the flight path with second flight conditions to determine a second flight duration;
      store in the data store the first flight conditions, the first flight duration, the second flight conditions, and the second flight duration;
      receive an indication of an item;
      determine that the item is maintained in an inventory at the source location;
      determine that the item is to be delivered to the delivery destination;
      determine current flight conditions between the source location and the delivery destination;
      obtain from a data store, an estimated flight duration corresponding to at least one of the first flight duration or the second flight duration stored in the data store for the flight path between the source location and the delivery destination, the estimated flight duration corresponding to the flight path and the current flight conditions;
      determine an aerial delivery time estimate based at least in part on the estimated flight duration; and
      provide an indication of the aerial delivery time estimate.

7. The aerial delivery service of claim 6, wherein the program instructions further cause the one or more processors to at least:
   determine a first energy consumption corresponding to the first flight;
   determine a second energy consumption corresponding to the second flight; and
   store in the data store and prior to receipt of the indication of the item:
      the first energy consumption for the flight path; and
      the second flight duration or the second energy consumption for the flight path.

8. The aerial delivery service of claim 7, wherein:
   the program instructions that cause the one or more processors to determine the current flight conditions further cause the one or more processors to determine that the current flight conditions correspond to the first flight conditions; and
   the estimated flight duration is the first flight duration.

9. The aerial delivery service of claim 6, wherein the program instructions further cause the one or more processors to at least:
   determine that the item is eligible for aerial delivery.

10. The aerial delivery service of claim 6, wherein the program instructions further cause the one or more processors to at least:
    determine that actual flight data is maintained in the data store and corresponds to the flight path and the current flight conditions, the actual flight data representative of an actual flight between the source location and the delivery destination along the flight path and with the current flight conditions; and
    determine at least one of:
       the aerial delivery time estimate further based at least in part on a flight duration corresponding to the actual flight data; or
       an estimated time until delivery based at least in part on the flight duration corresponding to the actual flight data.

11. The aerial delivery service of claim 6, wherein the current flight conditions include at least one of a wind speed, a wind direction, a temperature, a time of day, a day of week, a precipitation level, a lumens level, an airspace congestion level along the flight path, a humidity level, or a barometric pressure level.

12. The aerial delivery service of claim 6, wherein the program instructions further cause the one or more processors to at least:
    determine that the aerial delivery time estimate does not exceed a threshold; and
    send for presentation a delivery time indicating a duration of time by which the item can be delivered to the delivery destination upon receipt of a request for delivery of the item to the delivery destination.

13. The aerial delivery service of claim 6, wherein the indication of the item corresponds to a request to purchase the item from an electronic commerce provider.

14. The aerial delivery service of claim 6, wherein the indication of the aerial delivery time estimate includes at least one of a delivery timeframe or an estimated time until delivery.

15. The aerial delivery service of claim 6, wherein the aerial delivery time estimate is further based at least in part on one or more of a preparation time to prepare the item for aerial transport, a delivery completion time to complete a delivery of the item at the delivery destination, or an inventory condition.

16. The aerial delivery service of claim 6, wherein the program instructions further cause the one or more processors to at least:
    receive from an aerial vehicle actual flight data corresponding to the flight path and including measured flight conditions and a flight duration; and
    store in the data store, the actual flight data corresponding to the flight path, the measured flight conditions, and the flight duration, wherein the stored actual flight data is used to determine an estimated flight duration for a future flight along the flight path based at least in part on flight conditions.

17. A computer-implemented method, comprising:
simulating a plurality of flights along a flight path from a source location to a delivery destination, wherein at least two of the plurality of flights are simulated using at least one different flight condition;
determining for each of the plurality of flights and based on the simulation and the respective flight conditions, a time duration required to complete the flight from the source location to the delivery destination;
storing in a data store and for each of the plurality of flights, an association with the flight path, the flight conditions, and the respective flight duration;
subsequent to storing in the data store:
  receiving a request corresponding to an item stored at the source location;
  determining current flight conditions between the source location and the delivery destination;
  obtaining from the data store a flight duration corresponding to a flight of the plurality of flights along the flight path and having flight conditions corresponding to the current flight conditions;
  determining, based at least in part on the flight duration obtained from the data store and corresponding to the current flight conditions, an aerial delivery time estimate;
  determining that the aerial delivery time estimate is below a threshold; and
  providing an indication that the item is available for aerial transport from the source location to the delivery destination within a defined time from a receipt of a request to deliver the item to the delivery destination.

18. The computer-implemented method of claim 17, further comprising:
subsequent to providing the indication that the item is available for aerial transport, receiving the request to deliver the item to the delivery destination;
initiating an aerial transport of the item from the source location to the delivery destination;
determining, based at least in part on the current flight conditions and the stored respective flight conditions and the flight duration, an estimated time until delivery of the item to the delivery destination; and
providing a second indication of the estimated time until delivery.

19. The computer-implemented method of claim 17, further comprising:
determining for each of the plurality of flights and based on the simulation and the respective flight conditions, at least one of:
  an energy consumption indicating an amount of energy consumed by an aerial vehicle aerially navigating the respective flight path; or
  a terrain type indicating a type of terrain over which the respective flight path passes.

20. The computer-implemented method of claim 17, further comprising:
receiving from an aerial vehicle aerially navigating along the flight path, actual flight data, the actual flight data including measured flight conditions and an actual flight duration; and
storing in the data store, an association with the flight path, the measured flight conditions, and the actual flight data.

* * * * *